US012787224B2

(12) United States Patent
Stroud et al.

(10) Patent No.: US 12,787,224 B2
(45) Date of Patent: Nov. 3, 2026

(54) COMPRESSOR WITH INTEGRATED COOLING

(71) Applicant: ICEBOX HEAT PUMPS INC., Petaluma, CA (US)

(72) Inventors: Matthew Brandon Stroud, Petaluma, CA (US); Jodie Prud'Homme, San Francisco, CA (US); Matthew James Lawrence, Portland, OR (US)

(73) Assignee: Icebox Heat Pumps Inc., Petaluma, CA (US)

(*) Notice: Subject to any disclaimer, the term of this patent is extended or adjusted under 35 U.S.C. 154(b) by 0 days.

(21) Appl. No.: 19/544,713

(22) Filed: Feb. 19, 2026

(65) Prior Publication Data

US 2026/0247575 A1 Aug. 20, 2026

Related U.S. Application Data

(60) Provisional application No. 63/760,962, filed on Feb. 20, 2025, provisional application No. 63/760,949, filed on Feb. 20, 2025, provisional application No. 63/760,973, filed on Feb. 20, 2025.

(51) Int. Cl.
*H05K 7/20* (2006.01)

(52) U.S. Cl.
CPC ..... *H05K 7/20354* (2013.01); *H05K 7/20827* (2013.01)

(58) Field of Classification Search
CPC ...................... H05K 7/20354; H05K 7/20827; F04B 43/10; F16K 7/07
See application file for complete search history.

(56) References Cited

U.S. PATENT DOCUMENTS 2,627,874 A * 2/1953 Johnson .................... F16K 7/07 251/5
3,352,321 A * 11/1967 Aupoix ..................... F16K 7/07 137/613

(Continued)

FOREIGN PATENT DOCUMENTS

EP 2054677 B1 10/2007
WO 2014/005229 A1 1/2014

OTHER PUBLICATIONS

Kowalski et al., Initial design and experimental results of a novel near-isothermal compressor for heat pump applications, 26th International Compressor Engineering Conference, Jul. 10-14, 2022, Paper 2776, pp. 1-12.

(Continued)

*Primary Examiner* — Patrick C Williams
(74) *Attorney, Agent, or Firm* — Sheppard Mullin Richter & Hampton LLP

(57) ABSTRACT

Compressors with integrated cooling and systems incorporating compressors with integrated cooling are disclosed. The compressors are configured to simultaneously compress and cool a working fluid such as $CO_2$ using a movable wall between a fluid compression chamber and a fluid in an adjacent or surrounding fluid chamber. The compressors employ a method of cooling a fluid in which the working fluid is compressed and simultaneously cooled. The compressors can be used, for example, in data center cooling systems.

30 Claims, 17 Drawing Sheets

(56) References Cited

U.S. PATENT DOCUMENTS

| | | | | | |
|---|---|---|---|---|---|
| 3,397,860 | A * | 8/1968 | Bushmeyer | F16K 7/07 | 251/5 |
| 4,439,112 | A * | 3/1984 | Kitsnik | F04B 9/107 | 91/275 |
| 5,336,051 | A * | 8/1994 | Tamari | A61M 1/3621 | 417/474 |
| 5,497,631 | A | 3/1996 | Lorentzen et al. | | |
| 5,549,793 | A * | 8/1996 | Hellstrom | D21F 1/08 | 162/259 |
| 7,401,475 | B2 | 7/2008 | Hugenroth et al. | | |
| 7,647,790 | B2 | 1/2010 | Ignatiev et al. | | |
| 7,818,978 | B2 | 10/2010 | Ducoulombier et al. | | |
| 8,181,478 | B2 | 5/2012 | Ignatiev et al. | | |
| 9,234,480 | B2 | 1/2016 | Gayton | | |
| 10,533,810 | B2 | 1/2020 | Lynn et al. | | |
| 10,962,012 | B2 | 3/2021 | Santos et al. | | |
| 11,143,467 | B2 | 10/2021 | Lynn et al. | | |
| 12,203,686 | B2 | 1/2025 | Jansen et al. | | |
| 2012/0132284 | A1 * | 5/2012 | Buhler | F16K 7/07 | 137/613 |
| 2014/0007569 | A1 | 1/2014 | Gayton | | |
| 2017/0350529 | A1 * | 12/2017 | Vargas Fonseca | A61M 39/22 | |
| 2022/0010934 | A1 | 1/2022 | Radermacher et al. | | |
| 2025/0052455 | A1 | 2/2025 | Friedrich et al. | | |
| 2025/0164161 | A1 | 5/2025 | Radermacher et al. | | |
| 2025/0362062 | A1 | 11/2025 | Shanmugam et al. | | |

OTHER PUBLICATIONS

Liu et al., Dynamic modeling of near isothermal compressor for transcritical carbon dioxide cycle, 27th International Compressor Engineering Conference, Jul. 15-18, 2024, Paper 28516, pp. 1-13.

Heidari et al., On the strategies towards isothermal gas compression and expansion, 22nd International Compressor Engineering Conference, Jul. 14-17, 2014, Paper 2285, pp. 1-15.

Kim et al., A review of nearly isothermal compression technology, https://www.sciencedirect.com/science/article/pii/S0140700722002559, Manuscript_6da1e4e68a4decd4a7a765eb5aaa0a71, 2022, accessed Feb. 22, 2026, pp. 1-34.

Lee et al., Development of near-isothermal compression process utilizing liquid piston technology for transcritical $CO_2$ cycle, Thesis Dissertation, University of Maryland, Department of Mechanical Engineering, 2024, pp. 1-223.

* cited by examiner

COMPRESSOR WITH INTEGRATED COOLING

This application claims the benefit under 35 U.S.C. § 119(e) of U.S. Provisional Application No. 63/760,949 filed on Feb. 20, 2025, U.S. Provisional Application No. 63/760,973 filed on Feb. 20, 2025, and U.S. Provisional Application No. 63/760,962 filed on Feb. 20, 2025, each of which is incorporated by reference in its entirety.

FIELD

The disclosure relates to compressors with integrated cooling and systems incorporating compressors with integrated cooling. The compressors are configured to simultaneously compress and cool a working fluid such as $CO_2$ using a movable wall between the fluid compression chamber and a fluid in an adjacent or surrounding chamber. The compressors employ a method of cooling a fluid in which the working fluid is compressed and simultaneously cooled. The compressors and cooling systems can be used, for example, for data center cooling.

BACKGROUND

Gas compressors are an integral part of many heating and cooling systems, from household refrigerators to industrial, building-sized cooling units. In conventional systems compression occurs in a time that is short compared to that required for thermal exchange between the gas being compressed and the surrounding material.

The gas exits the compressor immediately after compression, before significant thermal exchange occurs. This allows the compression to be nearly isentropic.

Interstage cooling may be applied between successive compression stages.

Although the science and technology of compressors for cooling have been thoroughly studied, there is still room for improved efficiency in certain cooling scenarios. What is needed are designs for fluid compressors that are optimized for these applications.

SUMMARY

According to the present invention, a compressor comprises a compression chamber; an actuation chamber; and a compression chamber wall separating the compression chamber and the actuation chamber, wherein at least a portion of the compression chamber wall is movable.

According to the present invention, a cooling system comprises a compressor according to the present invention.

According to the present invention, a method of simultaneously compressing and cooling a working fluid uses a compressor according to the present invention.

According to the present invention, a method comprises: flowing a working fluid into a compression chamber; flowing a first fluid into a first actuation chamber to cause at least a portion of a compression chamber wall separating the compression chamber and the first actuation chamber to move toward a center of the compression chamber and thereby decrease a volume of the compression chamber; and simultaneously adding heat to the working fluid in the compression chamber or extracting heat from the working fluid in the compression chamber by flowing a heat exchange fluid through the first actuation chamber or by flowing a heat exchange fluid through a second actuation chamber in thermal contact with the compression chamber.

According to the present invention, a method comprises: flowing a working fluid into a compression chamber; flowing a first fluid into a first actuation chamber, causing a first compression wall separating the compression chamber and the first actuation chamber to compress the working fluid in the compression chamber; and simultaneously adding heat to the working fluid or extracting heat from the working fluid by flowing a second fluid through a second actuation chamber, wherein the compression chamber and the second actuation chamber are separated by a second compression chamber wall, wherein at least a portion of the first compression chamber wall is movable, and at least a portion of the second compression chamber wall is movable or the second compression chamber wall is rigid.

According to the present invention, a method of transferring heat using a transcritical vapor compression cycle comprises (1) near isentropically compressing and simultaneously cooling a working fluid to provide a compressed working fluid: (2) isobarically cooling the compressed working fluid to provide an isobarically cooled compressed working fluid; (3) near isentropically expanding the isobarically cooled compressed working fluid to provide an expanded working fluid; and (4) isobarically evaporating the expanded working fluid to provide an evaporated working fluid.

According to the present invention, a method of cooling a working fluid comprises: (1) near isentropically compressing and simultaneously isothermally cooling a working fluid to provide a cooled, compressed working fluid: (2) near isentropically expanding the cooled compressed working fluid to provide an expanded working fluid; and (3) isobarically evaporating the expanded working fluid to provide an evaporated working fluid.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

Figure 1A:
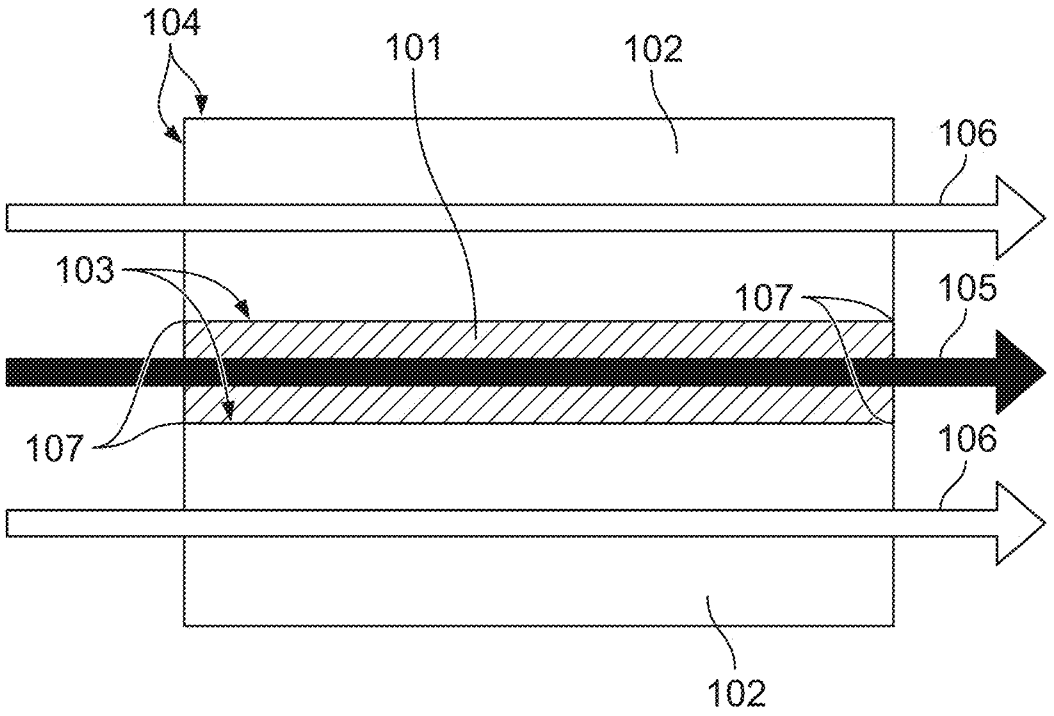
FIGS. 1A-1F show examples of compression chambers provided by the present disclosure configured for simultaneous compression and heat extraction.

For purposes of the following detailed description, it is to be understood that embodiments provided by the present disclosure may assume various alternative variations and step sequences, except where expressly specified to the contrary. Moreover, other than in any operating examples, or where otherwise indicated, all numbers expressing, for example, quantities of ingredients used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

"Fluid" refers to a liquid or a gas.

"Working fluid" refers a liquid or gas that undergoes compression.

"Actuation fluid" refers to a liquid or gas that applies the compressive force.

"Isentropic" refers to a process through which entropy does not change.

"Near isentropic" refers to a process through which entropy increases by, for example, from 10% to 20%.

Reference is now made to compressors, systems, and methods. The disclosed compressors, systems, and methods are not intended to be limiting of the claims. On the contrary, the claims are intended to cover all alternatives, modifications, and equivalents.

In a conventional compressor, a refrigerant gas is compressed so quickly that significant thermal exchange does not occur (near isentropic) within the compressor. If subsequent cooling is required, it may be done in separate, sequential steps. Although isentropic compression is optimal for many cooling applications, it is not the case for others. For example, in transcritical refrigeration cycles, isentropic compression followed by isobaric cooling leads to excessive work input. However, in a compressor with integrated cooling, compression and cooling are performed simultaneously instead of sequentially, as described in detail below. When such a compressor is operated according to an appropriate thermodynamic cycle, excessive work done by the compressor on the working fluid/refrigerant may be avoided and a decrease in work required to complete the cycle can be achieved.

A compressor with integrated cooling may use a high-surface-area-to-volume ratio compression chamber. A compressor can include multiple compression chambers which each have large surface areas for thermal exchange. The surface through which thermal exchange occurs may also be the surface through which compressive force is applied. A compressor may be designed with as many compression chambers as needed to achieve a desired flow rate of compressed gas.

Desired $CO_2$ initial and final states (e.g. temperatures and pressures) are determined by a particular heat pump application. These states lead to requirements for compression ratio, amount of thermal energy per unit mass to be removed, and the surface area needed for thermal exchange. Per-chamber surface area may be determined by dividing by the number of compression chambers. Desired $CO_2$ mass flow determines overall and per-chamber volumes, and desired initial and final pressures together with surface areas and cycle rate determine the required compressive force.

In an example design, 2,000 chambers, each having 25 cm by 25 cm top and bottom movable walls spaced 7 mm apart and cycled at 0.5 Hz, produce a compression ratio of 2 and mass flow of 9 kg/s.

FIGS. 1A-1F show examples of a compressor for simultaneous compression and heat extraction of a working fluid provided by the present disclosure. A working fluid to be compressed 105 is introduced into a compression chamber 101 which is bounded by movable, heat-conducting walls 103. The movable walls 103 separate the compression chamber 101 from actuation chambers 102. When a higher pressure actuation fluid (gas or liquid phase) 106 is introduced into actuation chambers 102, the actuation fluid 106 pushes the movable walls 103 toward the center of the compression chamber 101. The working fluid 105 in the compression chamber 101 is compressed, and at the same time, heat is removed from the compressed gas through the large surface-area, movable, heat-conducting walls 103 separating the compression chamber 101 and actuation chambers 102. The compression chamber 101 and actuation chambers 102 are bounded by rigid walls 104 enclosing the compressor The perimeter 107 of the movable walls 103 are fixed at the interface with rigid walls 104 such that the perimeter does not move during operation of the compressor.

FIG. 1A shows an example of the structure of a compressor with actuation fluid 106 within actuation chambers 102 having the same pressure as that of the working fluid 105 within compression chamber 101.

Figure 1B:
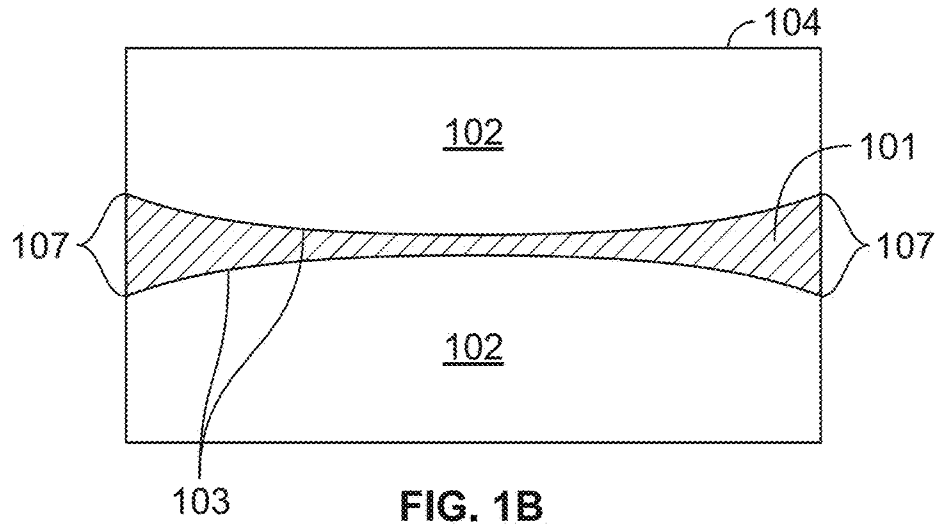

FIG. 1B shows an example of the structure of the compressor with the actuation fluid within outer chambers 102 having a greater pressure than that of the working fluid within compression chamber 101 causing movable walls 103 to move toward the center of compression chamber 101.

Figure 1C:
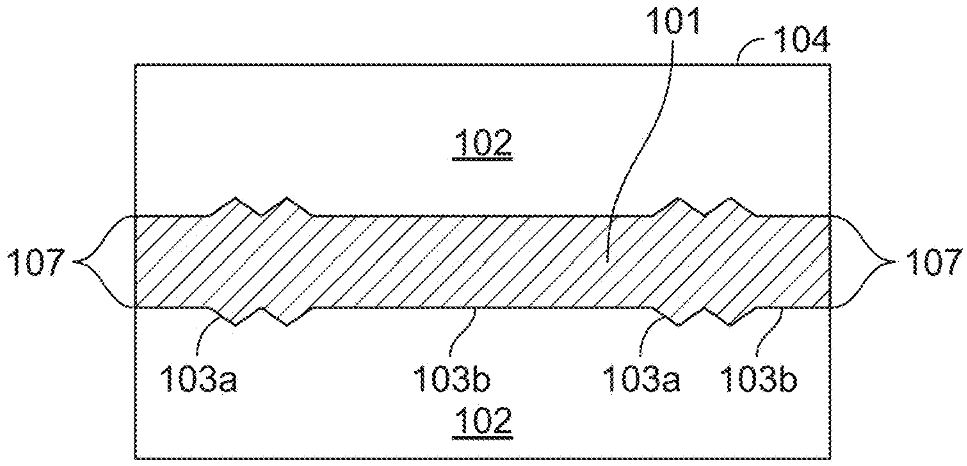

FIG. 1C shows an example of a compressor in which the movable walls 103 include flexible sections and rigid sections. The compressor shown in FIG. 1C includes a compression chamber 101, actuation chambers 102, movable walls 103 with flexible sections 103*a* and rigid sections 103*b* with the perimeter 107 of the movable walls 103 fixed at the interface with rigid walls 104.

Figure 1D:
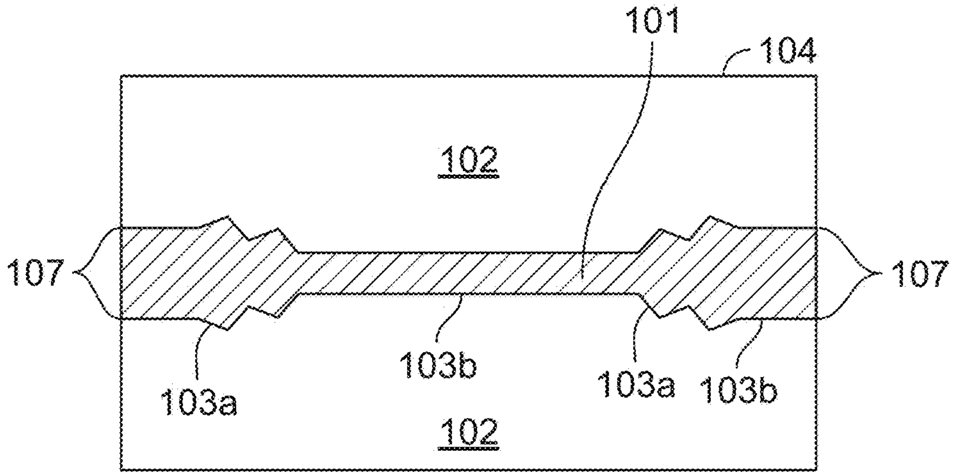

As shown in FIG. 1D pressure exerted by a fluid in actuation chambers 102 cause rigid section 103*a* between flexible sections 103*b* to move toward the center of compression chamber 102. The perimeter 107 of the movable walls 103 remains fixed at the interface with rigid walls 104. The flexible sections 103*a* of the movable walls accommodate the motion as the center rigid section 103*b* to move toward the center of the compression chamber 101.

The flexible sections can be formed from any suitable material and have a suitable structure as configured to allow a rigid section of a movable wall to move toward the center of the compression chamber in response to pressure exerted by the fluids in one or both of the adjoining actuation chambers. A movable compression chamber wall can comprise, for example, a first rigid section physically attached to a rigid outer compressor wall, a first flexible section, a center rigid section, a second flexible section, and a second rigid section physically connected to a rigid outer wall of the compressor. For example, the flexible sections can comprise an elastomer, a spring, a bellows, or other flexible structure, or a combination of any of the foregoing.

Materials forming a rigid compression chamber wall can be selected to optimize thermal transfer from the working fluid in the compression chamber to the actuation fluid and/or heat transfer fluid in an actuation chamber.

Materials forming a flexible compression chamber wall can be selected to optimize flexibility, thermal transfer from the working fluid in the compression chamber to the actuation fluid and/or heat transfer fluid in an actuation chamber, ability to withstand any transient pressure differentials during operation, and be chemically compatible with working and active fluids.

Figure 1E:
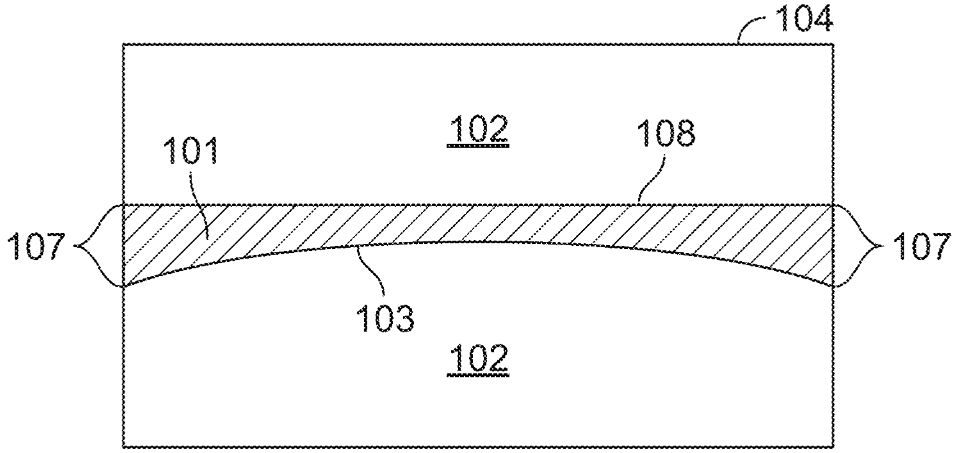
Figure 1F:
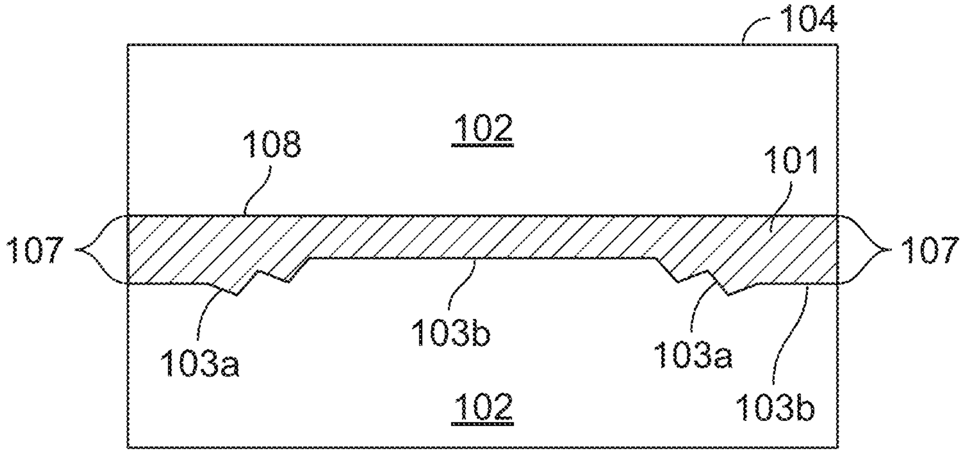

A compressor provided by the present disclosure can include one movable wall and a rigid wall that does not move in response to pressure exerted by a fluid in an actuation chamber. FIGS. 1E-1F show a compressor with a compression chamber 101 bounded by a movable wall 103*c* and a rigid wall 103*d*. The compressor shown in FIGS. 1E-1F include compression chamber 101, actuation chambers 102, movable compression chamber wall 103, rigid compression chamber wall 108, where the perimeter 107 of the compression chamber walls 103/108 are fixed to rigid enclosure walls 104. As shown in FIG. 1F pressure exerted by a fluid in actuation chambers 102 causes movable compression chamber wall 103*b* to move toward the center of the compression chamber 101 and rigid compression chamber wall 108 does not move in response to the pressure.

The actuation fluid in the actuation chambers adjoining a compression chamber can be the same or can be different. For example, the fluid in an actuation chamber can be an actuation fluid, a heat exchange fluid, or an actuation fluid that may or may not also be a heat exchange fluid.

Figure 2A:
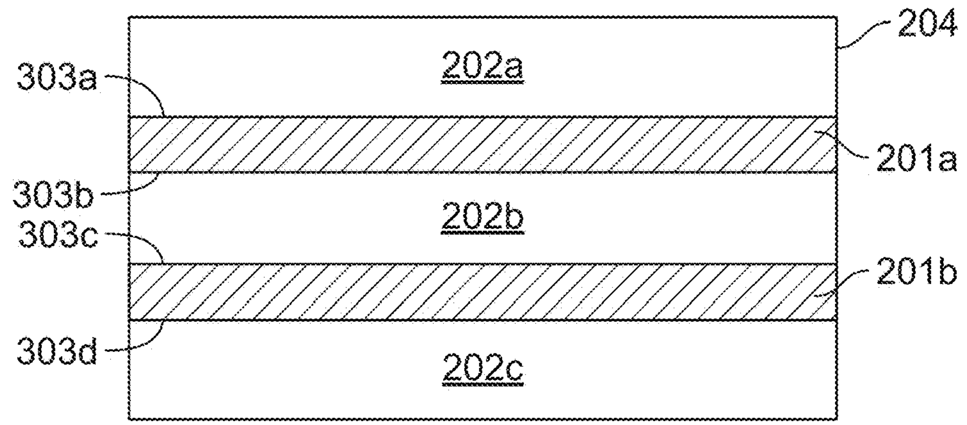
FIGS. 2A-2C show examples of a stacked plate design for a compressor with integrated cooling provided by the present disclosure.
Figure 2B:
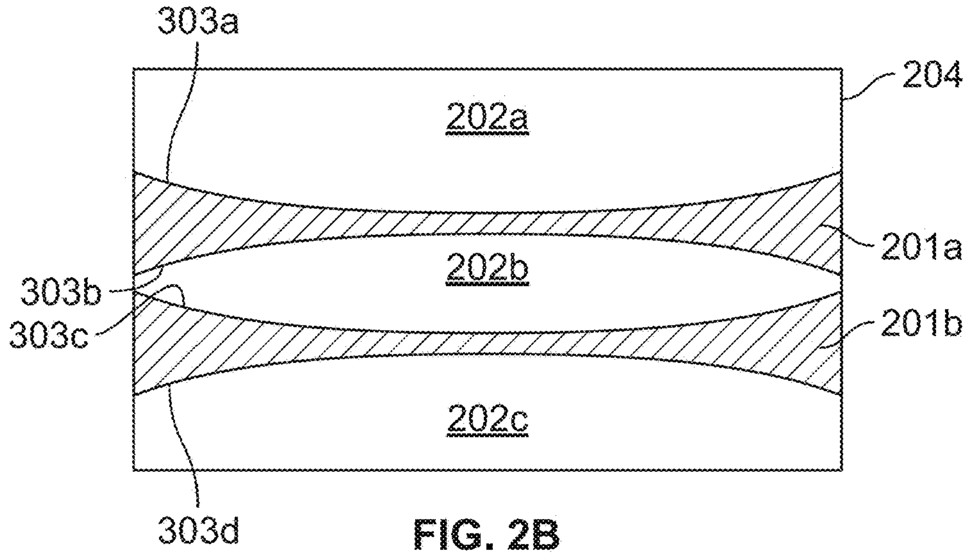
Figure 2C:
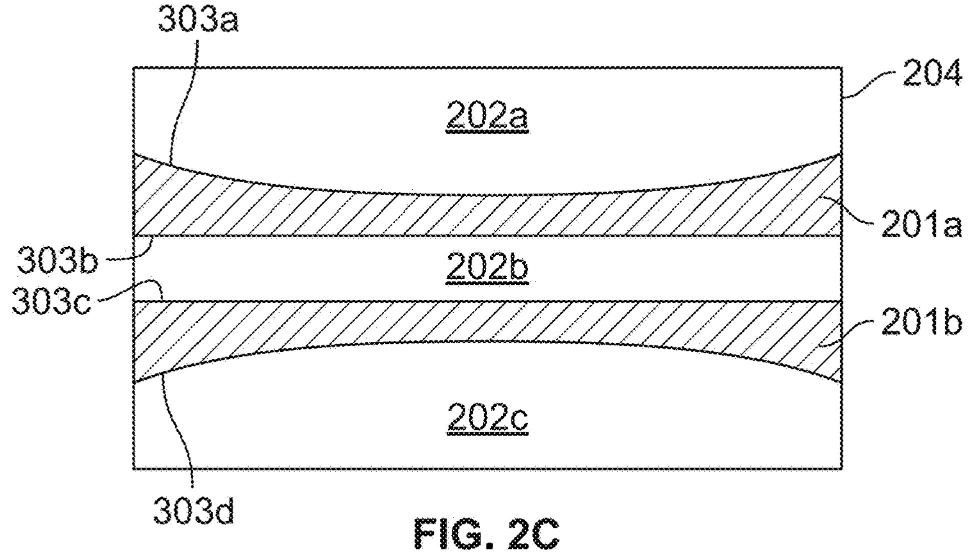

A compressor provided by the present disclosure can have two or more compression chambers and three or more actuation chambers. Each compression chamber can be adjacent to two actuation chambers. This configuration is referred to as a stacked compression chamber design. Examples of a compressor having a stacked flexible chamber design are shown in FIGS. 2A-2C. FIG. 2A shows a compressor having two compression chambers 201*a*/201*b* and three actuation chambers 202*a*/202*b*/202*c*. Each compression chamber is bounded by two compression chamber walls 203*a*/203*b* or/203*c*/203*d*, at least one wall of each pair is movable, and the other can be movable or rigid. The perimeter of each compression chamber wall 203*a*/203*b*/203*c*/203*d* is physically attached to outer compressor walls 204. The working fluid in compression chambers 201*a* and 201*b* can be the same or different. The actuation fluid in each of actuation chambers 202*a*/202*b*/202*c* can be the same or different. For example, the fluid within actuation chamber 202*b* can be a thermal transfer fluid, and the fluid within actuation chambers 202*a* and 202*c* can be an actuation fluid.

As shown in FIG. 2B pressure exerted by actuation fluid in actuation chambers 202*a*/202*b*/202*c* can cause movable chamber walls 203*a*/203*b*/203*c*/203*d* to move toward the center of the respective compression chambers.

As shown in FIG. 2C, pressure exerted by actuation fluid in actuation chambers 202*a* and 202*c* can cause movable compression chamber walls 203*a* and 203*d* to move toward the center of the respective compression chambers. In the embodiment shown in FIGS. 2B and 2C, compression chamber walls 203*b* and 203*c* can be rigid and configured to optimize thermal transport and the fluid within actuation chamber 202*b* can be a heat transfer fluid.

A compression chamber and an actuation chamber can have any suitable shape. For example, in a dimension perpendicular to the direction of fluid flow, can have a square, rectangular, round, oval, or triangular shape. The shape of the chambers can be configured to provide a large surface-to-volume ratio with low stroke. Low stroke means that motion of the movable walls are minimal and that the surface area remains nearly constant during a compression cycle.

Figure 3:
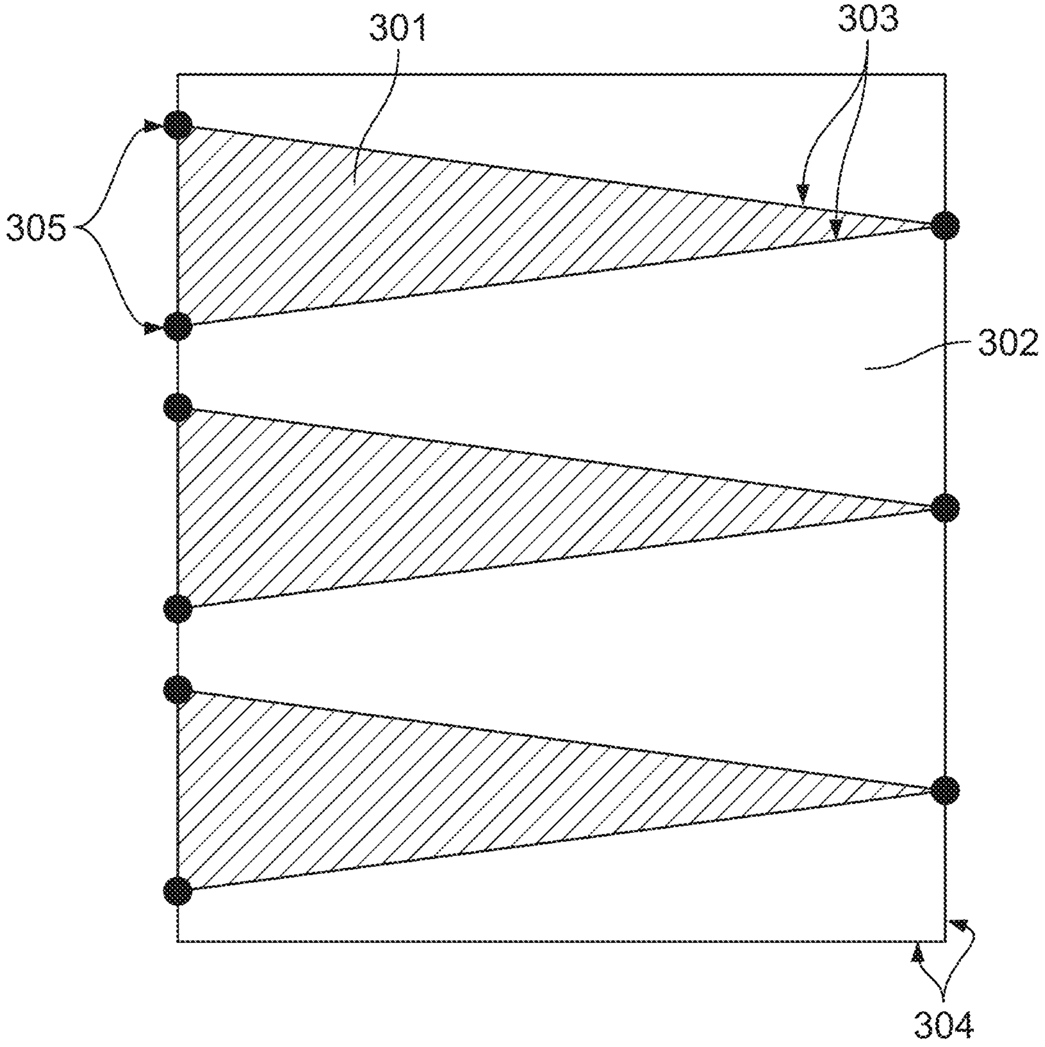
FIG. 3 show examples of a stacked wedge design for a compressor with integrated cooling provided by the present disclosure.

FIG. 3 shows an example of a stacked chamber design with wedge-shaped chambers for a compressor with integrated cooling provided by the present disclosure. Fluid flow perpendicular to the plane of the drawing. The compressor includes several compression chambers 301. The compression chambers 301 are separated from adjoining actuation chambers 302 by large surface-area compression chamber walls 303, at least one of which is movable. The perimeters of the compression chambers 301 and actuation chambers 302 are bounded by rigid compressor walls 304. The perimeter 305 of movable walls 303 are secured to rigid compressor walls 304. When a higher pressure fluid (gas or liquid phase) is introduced into the actuation chambers 302, pressure exerted on the movable walls 303 causes the movable walls to move toward the center of respective compression chambers 301 and simultaneously removes heat from the fluid in the compression chambers 301 through the movable walls 303. Thus, the working fluid in the compression chambers 301 is simultaneously compressed and cooled by the pressure exerted by the fluid in the actuation chambers 302. A compressor having multiple stacked compression chambers 301 and actuation chambers is shown in FIG. 3 and is configured to provide sufficient volume to provide a desired flow rate of the working fluid.

Figure 4:
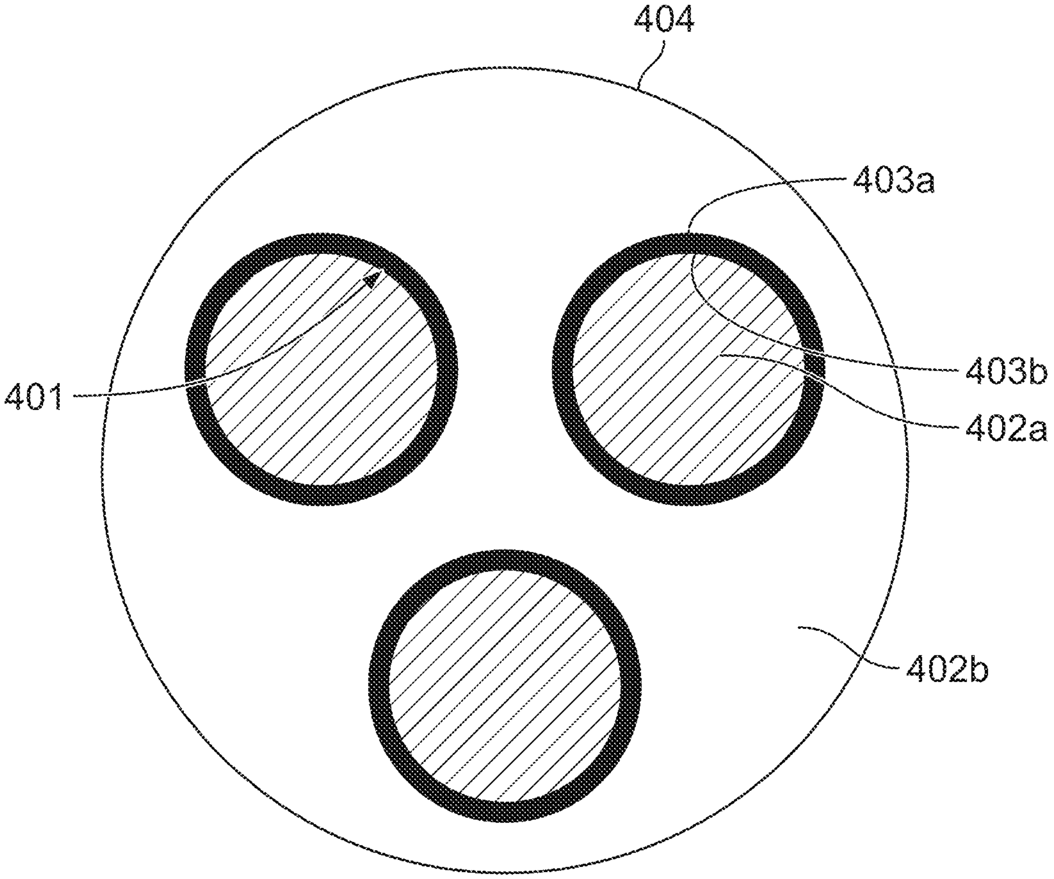
FIG. 4 shows an example of a cylindrical design for a compressor with integrated cooling provided by the present disclosure.

FIG. 4 shows a tubular design for a compressor with integrated cooling provided by the present disclosure. Referring to FIG. 4, fluid flows perpendicular to the plane of the drawing. The compressor includes several small-volume, tubular-shaped compression chambers 401 with large surface-area, movable compression chamber walls 403*a*/403*b*. One or both of the annular compression chamber walls 403*a*/403*b* can be configured to be moveable. Actuation chambers 402*a*/402*b* can contain an actuation fluid or a heat exchange fluid. When a higher pressure, relative to the pressure of the working fluid within the compression chambers is introduced into the actuation chamber 402*a* and/or 402*b*, the higher pressure actuation fluid exerts pressure on the movable walls 403*a* and/or 403*b* and removes heat from the working fluid within the compression chambers 401 through the compression chamber walls 403*a*/403*b*. At least a portion of the compression chamber walls is movable. The perimeters of the compression chamber walls can be fixed. One or more sections of the compression chamber walls can be movable and one or more sections can be rigid.

Thus, the working fluid within the compression chambers can be simultaneously compressed and cooled by the pressure exerted by the fluid in the actuation chambers 402*a*/402*b*. As shown in FIG. 4 multiple tubular compression chambers can be used to provide sufficient heat exchange volume to achieve a desired working fluid flow rate.

Figure 5:
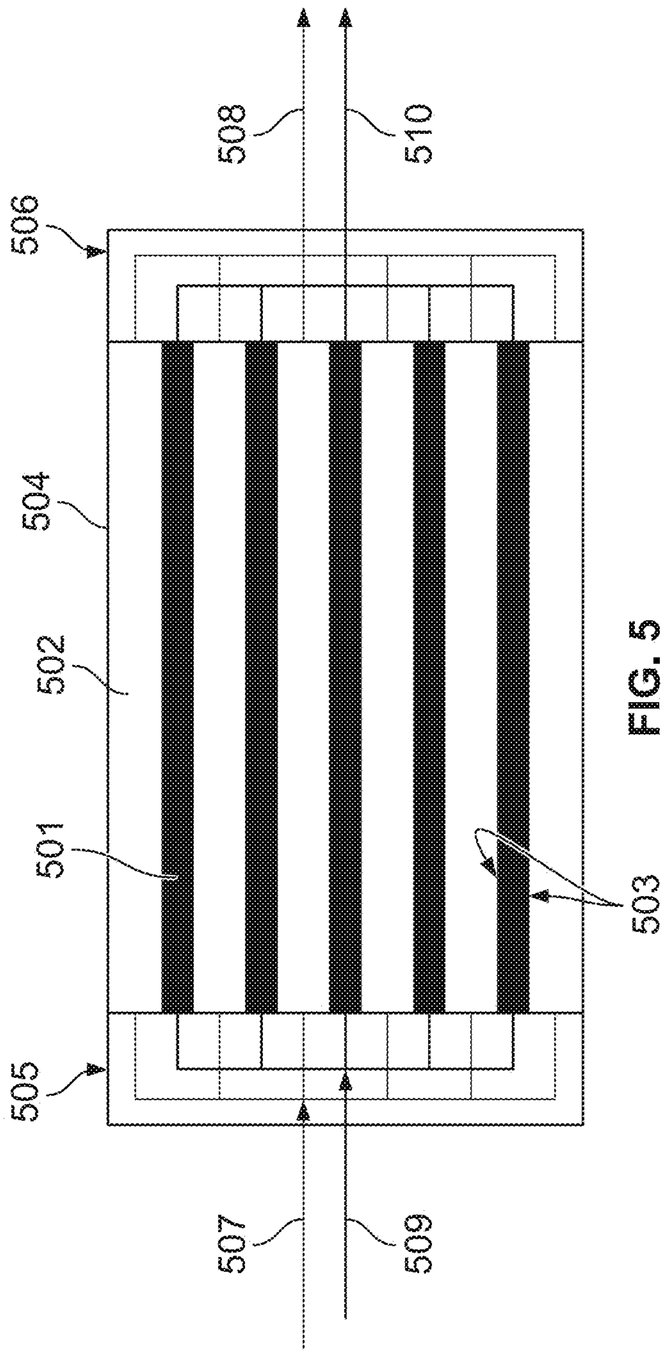
FIG. 5 shows an example of a stacked plate design for a compressor with integrated cooling provided by the present disclosure within input and output plenums.

FIG. 5 shows a stacked parallel plate design for a compressor with integrated cooling provided by the present disclosure. Fluid flows in the plane of the drawing, from left to right. The compressor includes several compression chambers 501 (black) bounded by large, surface-area movable compression chamber walls 503. The perimeters of the compression chamber walls are fixed to the rigid compressor walls 504. Each compression chamber is separated from two actuation chambers 502 (white) by at least one movable compression wall 503. When a higher pressure fluid is introduced into the actuation chambers 502, the higher pressure fluid exerts pressure on the movable compression chamber walls 503 and removes heat from the working fluid in the compression chamber through the movable compression chamber walls 503.

Thus, the fluid within a compression chamber 501 is simultaneously compressed and cooled by the pressure exerted by the actuation fluid within the actuation chambers 502. Multiple stacked-plate chambers can be used to provide sufficient actuation chamber volume to achieve a desired working fluid flow rate.

FIG. 5 also shows input plenum 505 and output plenum 506. The input plenum 505 distributes actuation fluid from an input conduit into the actuation chambers of the compressor, and the output plenum 506 combines the actuation fluid from the actuation chambers and directs the fluid to an output conduit.

FIG. 5 also shows input conduits 507 configured to distribute working fluid into the compression chambers of the compressor, and the output conduits 508 combines the working fluid from the compression chambers and directs the working fluid to from the compressor. FIG. 5 also shows input conduits 509 configured to distribute actuation fluid into the compression chambers of the compressor, and the output conduits 510 combines the actuation fluid from the compression chambers and directs the actuation fluid from the compressor.

A similar plenum configuration can be used with each of the compressor designs disclosed herein.

A compressor provided by the present disclosure can comprise one or more movable compression chamber walls separating a compression chamber and an actuation chamber.

A compression chamber can have a longitudinal dimension and a lateral dimension orthogonal to the lateral dimension.

A compression chamber can have a length, for example, greater than 5 cm, greater than 10 cm, greater than 20 cm, or greater than 30 cm. A compression chamber can have a length, for example, from 5 cm to 40 cm, from 5 cm to 30 cm, from 5 cm to 20 cm, or from 10 cm to 20 cm.

The perimeter of the compression chamber walls can be fixed during operation of the compressor. For example, the perimeter of the compression chamber walls can be physically attached to the rigid walls of the compressor.

During operation of the compressor, at least a portion of a movable compression chamber wall can be configured to move in response to fluid pressure of an adjacent actuation chamber. At least a portion of a movable compression chamber wall can be configured to move in response to a mechanical actuator.

The intersection of the longitudinal dimension of a compression chamber wall with the rigid walls can be fixed such that the perimeter of the compression chamber wall does not move during operation of the compressor.

A compression chamber wall can have one or more flexible sections and one or more rigid sections. The one or more flexible sections can be disposed toward the perimeter of the compression chamber wall and the one or more rigid sections can be disposed toward the center of the compression chamber wall. Examples of flexible sections include springs, bellows, elastomers, or other flexible structure.

A compression chamber wall can have a thermal conductivity configured to transfer heat from the working fluid in the compression chamber to the actuation fluid flowing in the actuation chamber.

A compression chamber wall can have a thermal conductivity, for example, from 15 W/mK to 1,000 W/mK, from 50 W/mK to 750 W/mK, or from 100 W/mK to 500 W/mK. The compression chamber wall can have a thermal conductivity, for example, greater than 15 W/mK, greater than 50 W/mK, greater than 100 W/mK, greater than 500 W/mK, greater than 750 W/mK, or greater than 1,000 W/mK.

A compression chamber wall can have a thermal transfer coefficient, for example, from 10 W/$m^2$K to 3,000 W/$m^2$K, from 50 W/$m^2$K to 2,000 W/$m^2$K, from 100 W/$m^2$K to 1,750 W/$m^2$K, or from 500 W/$m^2$K to 1,500 W/$m^2$K.

A compression chamber wall can have a substantially constant thickness in the longitudinal and lateral dimensions.

A compression chamber wall can have a variable thickness in the longitudinal dimension and a substantially constant thickness in the lateral dimension. For example, a movable wall can have a thickness that is greater at the perimeter where the movable wall is fixed to the rigid compressor wall than toward the center of the length of the movable wall.

A compression chamber wall can have a thickness, for example, from 0.5 mm to 4.0 mm, from 0.5 mm to 2.0 mm, from 0.75 mm to 1.75 mm, or from 1.0 mm to 1.5 mm.

A compression chamber wall can be configured to bow inward toward the center of the compression chamber in response to pressure of an actuation fluid in the actuation chamber.

A compression chamber wall can have a thickness that decreases from the perimeter toward the center of the compression chamber wall.

A compression chamber wall can be formed from a homogeneous material or can be formed from a material that has a variable composition throughout or in portions of the cross-sectional dimension and/or the longitudinal dimension. A compression chamber wall or portions of a compression chamber wall can be formed from a composite material A compression chamber wall can comprise, for example, a shape memory alloy.

A compression chamber wall can have a deflection coefficient, for example, from 100 to 10,000 at a pressure, for example, from 2 MPa to 18 MPa, where the deflection coefficient refers to the plate width to maximum plate movement, i.e., the compression chamber wall width to compression chamber wall movement.

A compression chamber wall can have a deflection coefficient, for example, greater than 1,000, greater than 2,000, greater than 4,000, greater than 6,000, greater than 8,000, or greater than 10,000, at a pressure from 2 MPa to 20 MPa.

A compression chamber wall can have a deflection coefficient, for example, from 1,000 to 10,000, from 2,000 to 9,000, from 3,000 to 8,000, or from 4,000 to 7,000, at a pressure from 2 MPa to 20 MPa.

A compression chamber wall can be reversibly movable or a portion of the compression chamber wall can be reversibly movable. A reversibly movable wall refers to movable wall or portion of a movable wall that moves in response, for example, pressure exerted by a fluid in an adjacent actuation chamber and/or motion of a mechanical actuator and then restores to the initial position when the external force is removed.

A compression chamber can be bounded by a single compression chamber wall or can be bounded by a first compression chamber wall and a second compression chamber wall. At least a portion of the first compression chamber wall and at least a portion of the second compression chamber wall can be movable.

In certain compressors provided by the present disclosure, a compression chamber can be bounded by a movable compression chamber wall and a rigid compression chamber wall. The movable compression chamber wall can separate the compression chamber from an adjacent actuation chamber and can be configured to compress a working fluid within the compression chamber in response to pressure of a fluid in the adjacent actuation chamber. A rigid compression chamber wall can separate the same compression chamber from a second actuation chamber and the rigid compression chamber wall can be configured to thermally transport heat from the compressed working fluid to the actuation fluid in the second actuation chamber. A rigid compression chamber wall is configured to not move during operation of the compressor.

A compressor with integrated cooling provided by the present disclosure can comprise one or more compression chambers. A compression chamber can be configured to compress working fluid flowing through the compression chamber during operation of the compressor.

A compression chamber can have any suitable cross-sectional shape such as rectangular, square, circular, oval, triangular, corrugated, or a combination of any of the foregoing A compression chamber can have a volume, for example, from 1 $cm^3$ to 300 $cm^3$, such as from 5 $cm^3$ to 180 $cm^3$, from 10 $cm^3$ to 150 $cm^3$, from 25 $cm^3$ to 125 $cm^3$, or from 50 $cm^3$ to 100 $cm^3$. A compression chamber can have a volume, for example, greater than 1 $cm^3$, greater than 10 $cm^3$, greater than 50, greater than 100 $cm^3$, or greater than 150 $cm^3$.

A compression chamber can be characterized by a surface-area-to-volume ratio, for example, from 1 $mm^{-1}$ to 1,000 $mm^{-1}$, from 10 $mm^{-1}$ to 900 $mm^{-1}$, from 100 $mm^{-1}$ to 800 $mm^{-1}$, from 200 $mm^{-1}$ to 700 $mm^{-1}$, or from 300 $mm^{-1}$ to 600 $mm^{-1}$.

A compression chamber can be characterized by a surface-area-to-volume ratio, for example, greater than 1 $mm^{-1}$, greater than 10 $mm^{-1}$, greater than 100 $mm^{-1}$, greater than 200 $mm^{-1}$, greater than 400 $mm^{-1}$, greater than 600 $mm^{-1}$, or greater than 800 $mm^{-1}$.

A compression chamber can have a length, for example, from 5 cm to 30 cm and a width from 5 cm to 30 cm, wherein length refers to the direction of fluid flow, and width refers to the direction orthogonal to the direction of fluid flow. A compression chamber can have a length, for example, less than 50 cm, less than 40 cm, less than 30 cm, less than 20 cm, or less than 10 cm, and a width, for example, less than 50 cm, less than 40 cm, less than 30 cm, less than 20 cm, or less than 10 cm.

A compression chamber can comprise a working fluid.

A compressor provided by the present disclosure can comprise an actuation chamber. An actuation chamber can be characterized, for example, by a volume from 50 $cm^3$ to 1,000 $cm^3$, such as from 100 $cm^3$ to 750 $cm^3$, or from 200 $cm^3$ to 500 $cm^3$. An actuation chamber can have a volume, for example, greater than 50 $cm^3$, greater than 100 $cm^3$, greater than 250 $cm^3$, or greater than 750 $cm^3$. An actuation chamber can have a volume, for example, less than 1,000 $cm^3$, less than 750 $cm^3$, less than 500 $cm^3$, or less than 250 $cm^3$.

An actuation chamber can be characterized by a surface-area-to-volume ratio, for example, from 1 $mm^{-1}$ to 1,000 $mm^{-1}$, from 10 $mm^{-1}$ to 900 $mm^{-1}$, from 100 $mm^{-1}$ to 800 $mm^{-1}$, from 200 $mm^{-1}$ to 700 $mm^{-1}$, or from 300 $mm^{-1}$ to 600 $mm^{-1}$.

An actuation chamber can be characterized by a surface-area-to-volume ratio, for example, greater than 1 $mm^{-1}$, greater than 10 $mm^{-1}$, greater than 100 $mm^{-1}$, greater than 200 $mm^{-1}$, greater than 400 $mm^{-1}$, greater than 600 $mm^{-1}$, or greater than 800 $mm^{-1}$.

A compressor provided by the present disclosure can be adjacent to a first actuation chamber and a second actuation chamber.

A first compression chamber wall separating the compression chamber from the first actuation chamber can be movable or at least a portion of the first compression chamber wall can be movable.

A second compression chamber wall separating the compression chamber from the second actuation chamber can be movable, or at least a portion of the first compression chamber wall can be movable, or the second compression chamber wall can be rigid.

A first compression chamber wall and a second compression chamber wall can have the same physical, thermal, and mechanical properties, or can have different physical, thermal, and/or mechanical properties.

A first actuation chamber and a second actuation chamber can have the same physical properties and can be configured to transport the same or similar actuation fluid or can have different physical properties and/or can be configured to transport a different actuation fluid.

A second compression chamber wall can be movable within a pressure range, for example, from 2 MPa to 18 MPa.

A second compression chamber wall can be configured to move toward a center of the compression chamber in response to pressure exerted by a fluid in the second actuation chamber.

A second compression chamber wall can be configured to transfer heat from a working fluid in the compression chamber to a fluid in the second actuation chamber.

A second compression chamber wall can be characterized, for example, by a thermal conductivity from 15 W/mK to 1,000 W/mK.

A second compression chamber wall is characterized by a thermal transfer coefficient, for example, from 50 $W/m^2K$ to 2,000 $W/m^2K$.

A second compression chamber wall can be characterized, for example, by a thickness from 0.5 mm to 2 mm.

A second compression chamber wall can be characterized by a deflection coefficient (plate width to maximum plate movement) from 1,000 to 10,000 at a pressure from 2 MPa to 18 MPa.

A second actuation chamber can be characterized by a volume, for example, from 50 $cm^3$ to 10,000 $cm^3$ A compressor for integral cooling provided by the present disclosure can comprise a compression chamber inlet and a compression chamber outlet configured to flow a working fluid into and out of the compression chamber and to couple to external input and output fluid conduits, respectively.

A compressor for integral cooling provided by the present disclosure can comprise an actuation chamber inlet and an actuation chamber outlet configured to flow an actuation fluid into and out of the actuation chamber and to fluidly couple to external input and output actuation fluid conduits, respectively.

A compressor for integral cooling provided by the present disclosure can comprise an input plenum and/or an output plenum for each of the fluids. A plenum refers to a fluid distribution system configured to direct working fluid from a single input conduit into each of the compression chambers or to direct actuation fluid into each of the actuation chambers or configured to direct fluid from each of the compression chambers or each of the actuation chambers into a single output conduit.

In a compressor with integral cooling provided by the present disclosure the compression chamber can comprise a working fluid.

A working fluid can be a compressible fluid such as a compressible liquid or a gas. A working fluid can be a refrigerant. A working fluid can be air or hydrogen. A working fluid can be $CO_2$.

In a compressor with integral cooling provided by the present disclosure, an actuation fluid can be, for example, a gas or a liquid. An actuation fluid can have a higher thermal conductivity such as a thermal conductivity greater than 0.01 W/mK, greater than 0.05 W/mK. greater than 0.1 W/mK, greater than 0.2 W/mK, or greater than 0.5 W/mK, and a low viscosity such as a viscosity, for example, less than 0.1 Pa·s, less than 0.5 Pas, less than 1.0 Pa·s, less than 5.0 Pa·s, or less than 20.0 Pa·s.

Examples of suitable actuation fluids include hydraulic oils, combinations of glycol and water such as ethylene glycol/water or propylene glycol/water mixtures, air, hydrogen, carbon dioxide, or a synthetic refrigerant.

A compressor provided by the present disclosure can comprise a mechanical actuator. A mechanical actuator can be physically coupled to a compression chamber wall and can be configured to move at least a portion of the compression chamber wall during operation of the compressor.

Cooling systems provided by the present disclosure can comprise a compressor provided by the present disclosure.

A cooling system can comprise a fluid distribution unit fluidly coupled to the compression chamber outlet of the compressor; and a delivery unit fluidly coupled to the fluid distribution unit. The compressor can be configured to produce a compressed working fluid, the fluid distribution unit can be configured to receive the compressed working fluid, and the delivery unit can be configured to deliver saturated working fluid to a target apparatus.

A cooling system provided by the present disclosure can further comprise a heat exchanger, a cooler, an expander, a condenser, a throttling or expansion valve, an evaporator, or a combination of any of the foregoing The heat pump can comprise a super-critical $CO_2$ fluid compression cycle.

The compression and expansion stages in the heat pump may be bypassed or brought on-line depending on whether an ambient outside air temperature is colder or hotter than a desired data center equipment temperature.

A cooling system provided by the present disclosure can be a data center cooling system.

The rapid adoption of artificial intelligence based on large language models has dramatically increased demand for computing power in data centers. Much of the energy consumed by electronics in a data center must be removed as heat to prevent overheating.

Unfortunately, data center cooling today relies on environmentally hazardous, high global warming potential (GWP) refrigerants which are facing increased regulatory scrutiny. What is needed are efficient data center cooling systems that do not rely on hazardous refrigerants.

Data centers are often cooled by systems that rely on vapor compression cycles using hazardous, high global warming potential (GWP) refrigerants such as R134A and R410A. A series of heat exchangers between the vapor compression stage and the apparatus to be cooled add inefficiencies at each step. These steps may use sensible (rather than latent) heat, i.e., heat exchanged by a system that results in a change in temperature without a change in phase. This means that the fluids involved, such as air or water, are maintained at high temperature differences and low energy densities.

A carbon dioxide-based data center cooling system can provide highly efficient, isothermal cooling. A $CO_2$-based cooling system can be more efficient than those based on conventional approaches, in part because there are fewer heat exchange steps between the compression cycle and the cooling target. Isothermal, saturated $CO_2$ may be delivered directly to racks or to semiconductor devices at individually specified temperatures. $CO_2$ is denser than conventional refrigerants, is less expensive, and $CO_2$ leaks are less harmful than GWP refrigerant leaks.

Compared to water, $CO_2$ may be moved in smaller diameter pipes with lower flow work, further increasing efficiency. Furthermore, when the outside ambient air is cooler than the computing devices to be cooled, the compression and expansion parts of the $CO_2$ heat pump cycle may be bypassed, and heat may be transferred directly to the ambient air. In this regime, cooling fluids circulate around the loop absorbing heat from warm objects and dumping heat to the ambient air with reduced mechanical work needed.

Figure 6:
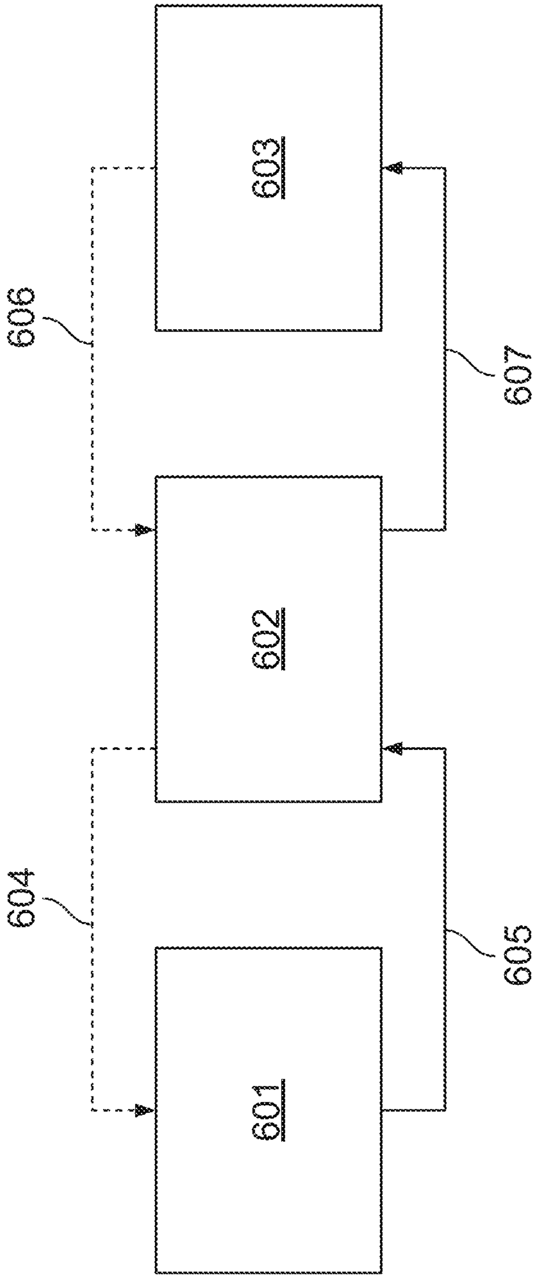
FIG. 6 shows a schematic of an example of a data center cooling system.

FIG. 6 is a block diagram of conventional cooling in a data center. A heat pump 601 with a refrigerant-to-water heat exchanger (HEX) produces chilled water 605. This heat exchanger can be located outside the room containing operating racks of electronic processors. The chilled water 603 can be delivered to an internal air handling unit 602 which contains a water-to-air heat exchanger. Finally chilled air 607 is delivered to electronic racks 603 containing, for example, heat producing central processing units and graphics processing units. Warm air 606 returns from the electronics to the air handling unit 602 and warm water 604 returns from the air handling unit 602 to the external heat pump 601.

Figure 7:
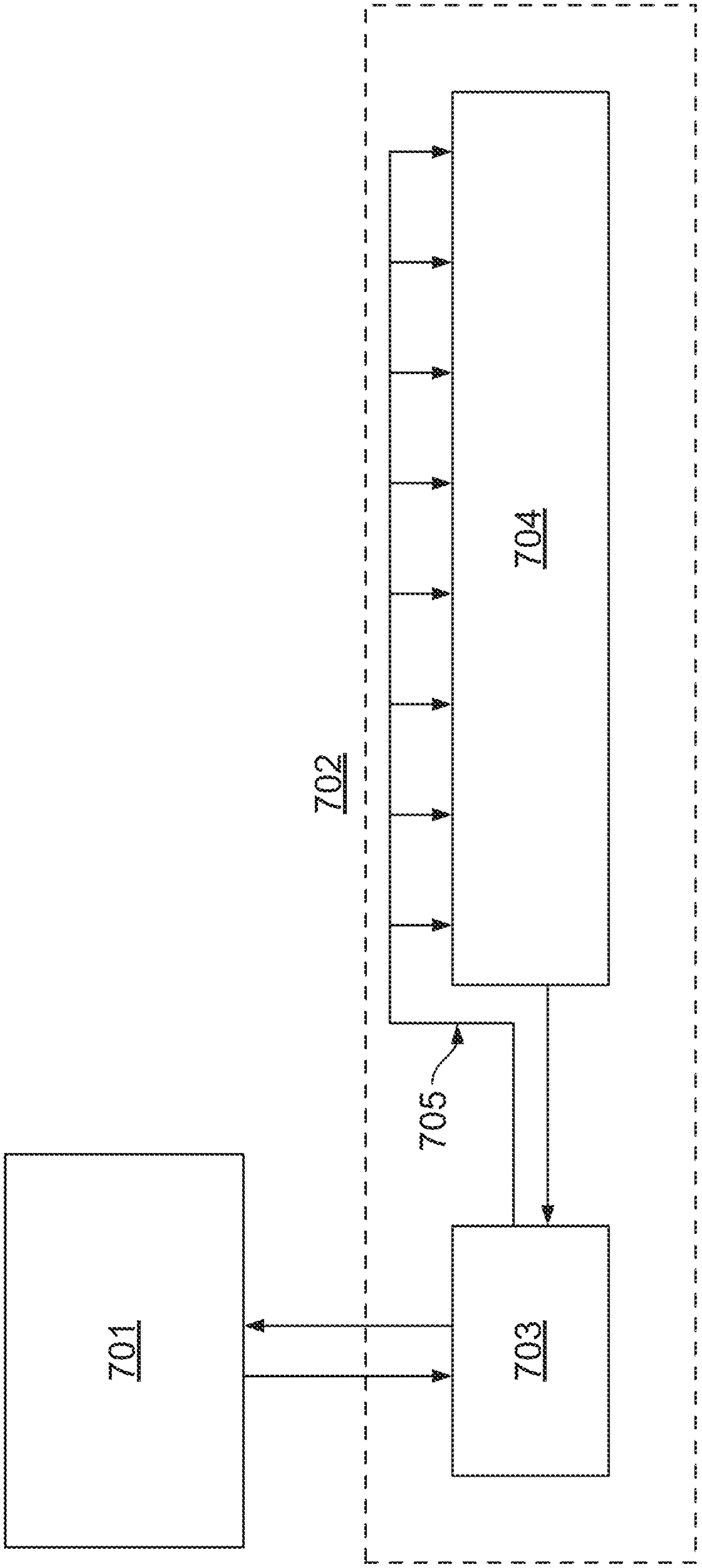
FIG. 7 shows a schematic of a data center cooling system with heat exchange to other cooling fluids.

FIG. 7 is a block diagram of a $CO_2$-based data center cooling system. FIG. 7 includes a heat pump 701 running a high efficiency transcritical vapor compression cycle directs $CO_2$ toward a distribution unit 702 within a data center via a saturated $CO_2$ loop 703. In this example, the $CO_2$ may then be used to produce cooled water, air, dielectric fluid, or other fluid. The integration system 704 shown in the figure may be located within the data center.

Isothermal, saturated $CO_2$ from the external heat pump 701 may be routed by the distribution unit 702 to the cooling targets 705 via a second saturated $CO_2$ loop (not shown) with no intermediate heat exchange steps such as without the external water-to-air heat exchange step of a conventional system. Post-expansion, mixed phase $CO_2$ from the vapor compression cycle is sent to the cooling plates for direct-to-chip cooling. In the cooling plates, the $CO_2$ absorbs heat and undergoes an isothermal phase change from a mostly liquid state to a mostly gas state. The saturated $CO_2$ cooling can be provided to maintain individual components such as a computer room air handler (CRAH), a near door heat exchanger (RDHx), direct-to-chip, and immersion, at specified temperatures.

A $CO_2$-based cooling system permits flexible operation as the temperature of outside ambient air varies with respect to the desired operating equipment temperature inside the data center. When ambient air is colder than the desired equipment temperature, compression and expansion stages in a heat pump may be reduced or bypassed. As the ambient air temperature rises to, or above, the desired operating equipment temperature, compression and expansion of the compressed fluid may be brought back online or increased.

Figure 8:
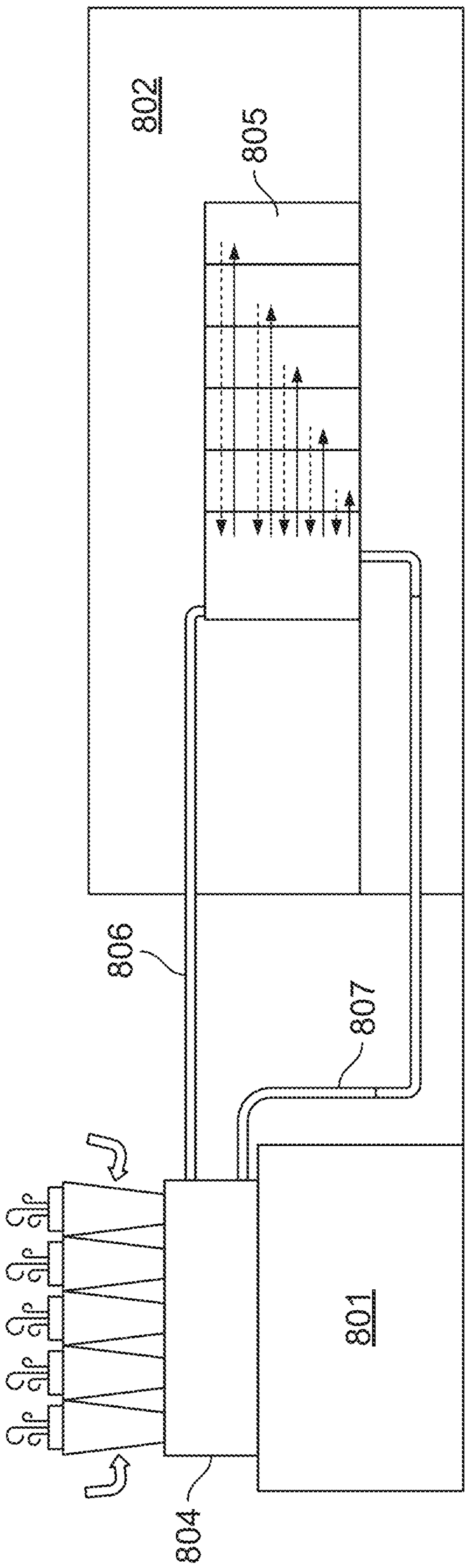
FIG. 8 shows a schematic of thermosyphon cooling in a $CO_2$-based data center cooling system.

FIG. 8 shows an example of a thermosyphon cooling system in a $CO_2$-based data center cooling system. A thermosyphon cooling system refers to a cooling system that uses natural convection to circulate a fluid, effectively managing heat exchange without the need for mechanical pumps. When the $CO_2$-based cooling system is operating in thermosyphon mode the compressor and expander in the transcritical vapor compression cycle can be bypassed. Saturated, liquid $CO_2$ absorbs heat from data center equipment via the $CO_2$ distribution unit. The $CO_2$ evaporates and becomes less dense as it absorbs heat. Upon leaving the distribution unit, $CO_2$ transfers heat to cooler ambient air via a fan-based system.

Next, as the $CO_2$ loses heat, it condenses and becomes denser. The change in density pulls the $CO_2$ through the loop by gravity, reducing or eliminating the need for a circulation pump.

Referring to FIG. 8, a data center cooling system can include a high-efficiency $CO_2$ heat pump 804 that produces cooled saturated, isothermal $CO_2$ 807 outside the data center 802. The system can include a $CO_2$ distribution unit 805 located inside the data center 802. The distribution unit 805 receives cooled, saturated, isothermal $CO_2$ from the heat pump 804 via a saturated $CO_2$ loop 806/807. Another saturated $CO_2$ loop delivers cooled, saturated, isothermal $CO_2$ from the distribution unit 805 to a cooling target such as a heat exchanger or an electronic device (not shown). After device cooling, the heated, e.g. 30° C., saturated liquid $CO_2$ 806 is returned from the $CO_2$ distribution unit to the high-efficiency $CO_2$ heat pump.

Compression and expansion stages in the heat pump 804 can be bypassed or brought online depending on whether an ambient outside air temperature is colder or hotter than a desired data center equipment operating temperature.

Compressors provided by the present disclosure can be used in various systems, such as heating, ventilation, air conditioning, and refrigerator systems, industrial heat pumps, data center cooling systems, industrial compression systems such as carbon capture, utilization, and storage (CCUS) compression systems, hydrogen gas compression systems, and air separation unit compression systems.

Vapor compression cycles are widely used in refrigeration. A common cycle involves near isentropic compression of a working fluid followed by isobaric cooling, near isentropic expansion, and isobaric evaporation, after which the compression cycle repeats.

Such a cycle moves heat from one place to another at the expense of work done to compress and move the compressed fluid, for example, through conduits.

Cooling has commercial importance in a wide range of applications. Recently the cooling demands of AI data centers have attracted attention. A large amount of heat must be removed from electronic devices in a data center so any increase in efficiency in doing so is valuable. Furthermore, current cooling systems use environmentally toxic refrigerants.

What is needed are vapor compression cycles that require less work input and are optimized for clean refrigerants.

A transcritical fluid vapor compression cycle operates with an environmentally friendly fluid such as $CO_2$ as a working fluid and with reduced work input compared to a conventional vapor compression cycle. Said another way, the transcritical compression cycle provides an improved coefficient of performance (COP), i.e. amount of heat moved per unit of work input, compared to a conventional vapor compression cycle.

The choice of $CO_2$ as a working fluid in cooling applications such as data center cooling means that a heat pump can operate in the transcritical regime because of the low critical point of $CO_2$ and the temperatures involved. The critical point of $CO_2$ occurs at a temperature of 31.1° C. and a pressure of 7.38 MPa (72.8 atm) beyond which $CO_2$ behaves as a supercritical fluid. The critical point is the temperature and pressure at which the distinct phases are indistinguishable. In this scenario near isentropic compression followed by isobaric fluid cooling requires extra work input that leads to a lower coefficient of performance.

In a transcritical $CO_2$ vapor compression cycle provided by the present disclosure, the work penalty for transcritical operation is reduced. This is accomplished by modifying the fluid cooling to approach isothermal behavior. In one approach, nearly isothermal fluid cooling can be performed in conjunction with compression. In this case compression is no longer isentropic.

Alternatively, nearly isothermal fluid cooling can be performed after isentropic compression.

Figure 9:
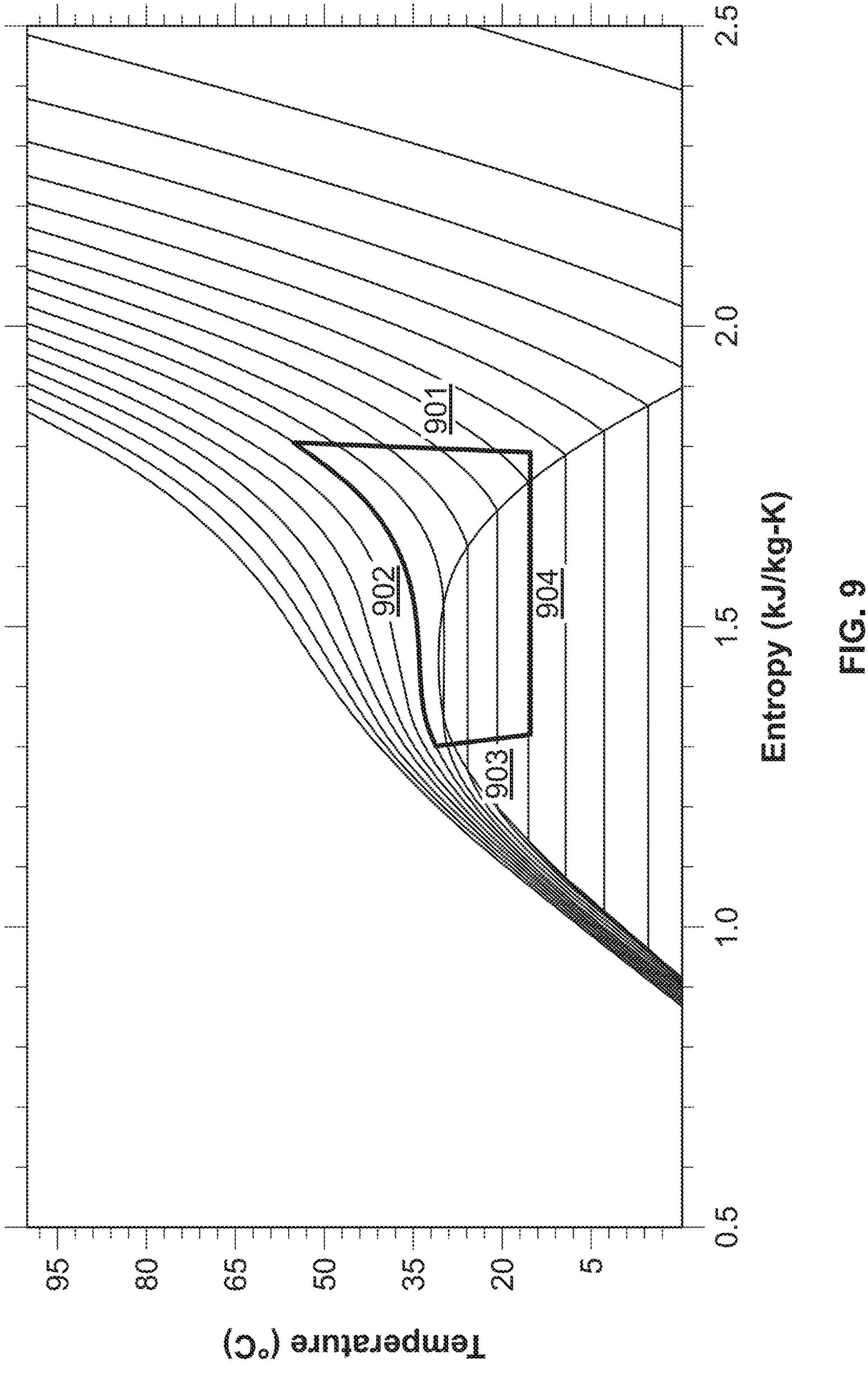
FIG. 9 shows a trans-critical $CO_2$ vapor compression cycle with near isentropic compression and isobaric fluid cooling.

A conventional transcritical $CO_2$ vapor compression cycle with near-isentropic compression followed by isobaric fluid cooling is shown in FIG. 9. In the figure, isobars are plotted in Temperature-Entropy (T-s) space. The steps in a conventional cycle are labeled 901 through 904 and indicated by thick lines on the plot.

Step 901 is the near-isentropic (i.e. nearly vertical on the plot) compression. Step 902 represents isobaric (i.e. following an isobar) fluid cooling. Step 903 represents near-isentropic expansion. Step 904 represents isobaric evaporation.

Figure 10:
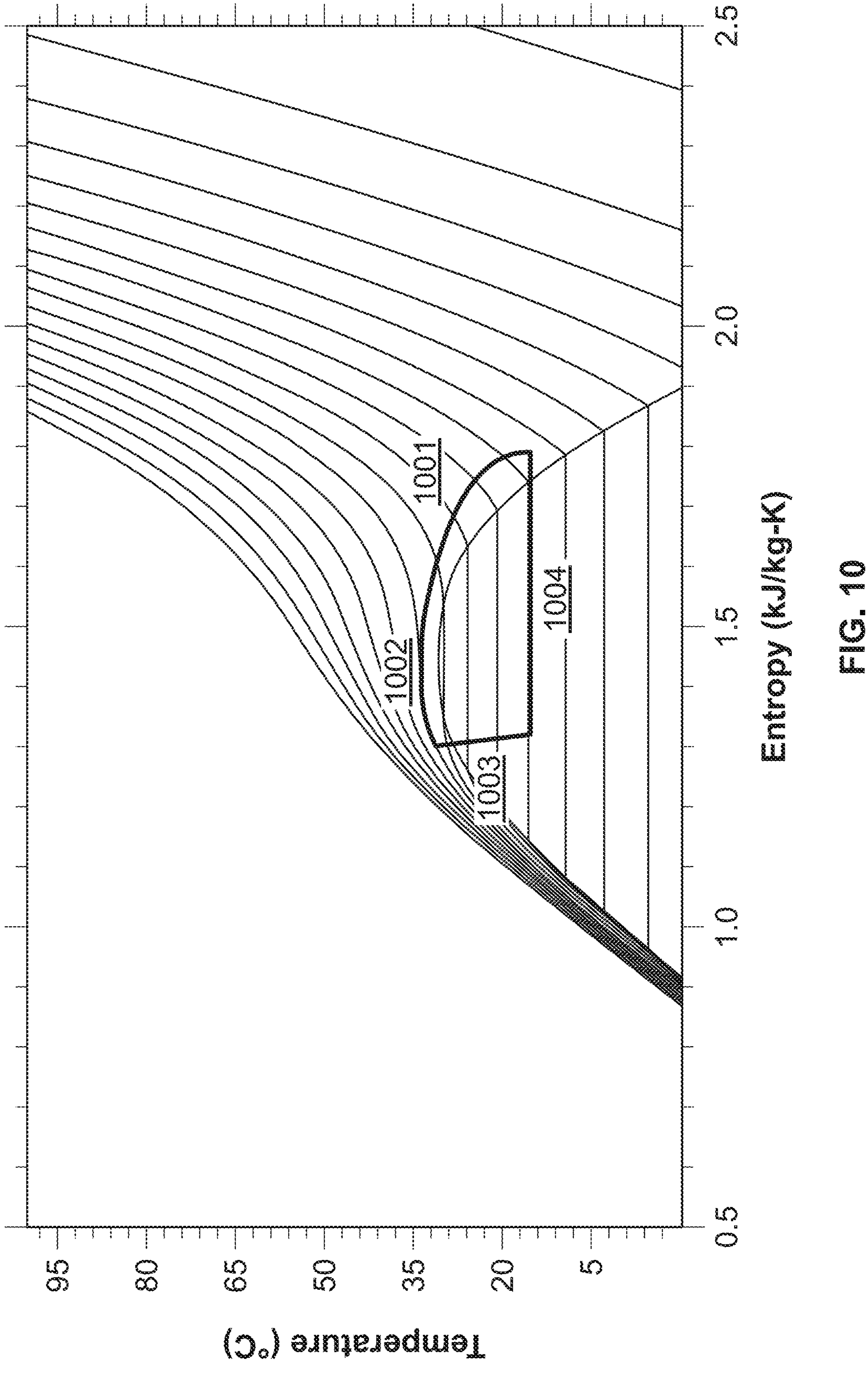
FIG. 10 shows a transcritical $CO_2$ vapor compression cycle with integrated compression and fluid cooling.

In a transcritical $CO_2$ vapor compression cycle provided by the present disclosure, the compression and fluid cooling steps are combined into the same step. The resulting path in T-s space can be as shown in FIG. 10. The net effect of the new cycle is reduced work required by the compressor in transitioning the $CO_2$ refrigerant from the post-evaporation state to pre-expansion state.

As explained below and as shown in FIG. 10, the shapes of paths 1001 and 1002 in T-s space depend on how compression and cooling of the fluid $CO_2$ refrigerant are done. FIG. 10 shows combined near-isentropic compression step 1001 and isobaric fluid cooling step 1002, near isentropic expansion step 1003, and near-isentropic expansion step 1004.

Figure 11:
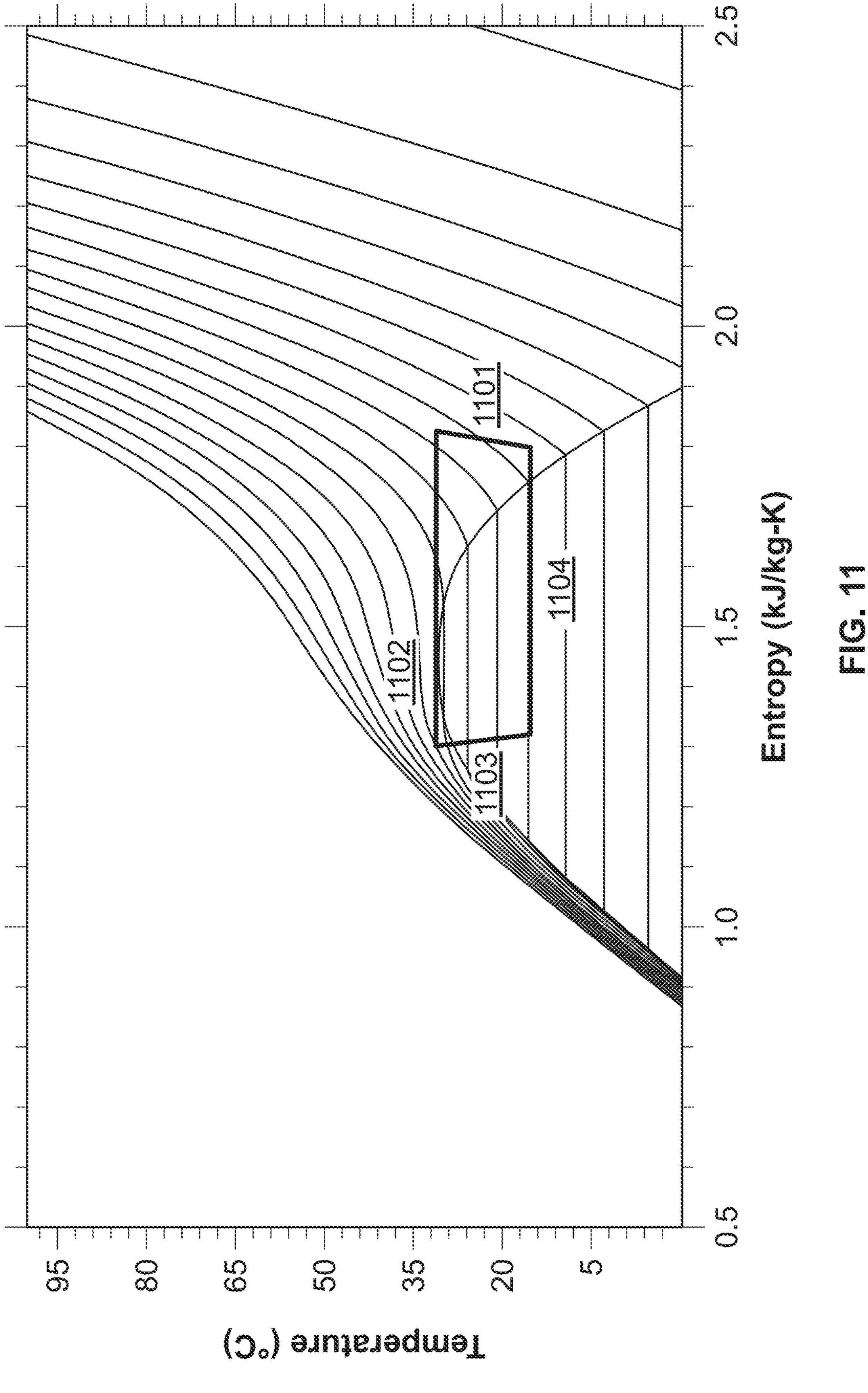
FIG. 11 shows a cooling cycle with near isentropic expansion followed by isothermal fluid cooling.

FIG. 11 shows an example of a $CO_2$ vapor compression cycle provided by the present disclosure. In this cycle, near isentropic compression to a lower pressure than the pre-expansion state (path 1101) is followed by isothermal fluid cooling in which the pressure is raised to the pre-expansion state (path 1102). These steps are followed by near isentropic expansion step 1103 and near-isentropic expansion step 1104.

Figure 12:
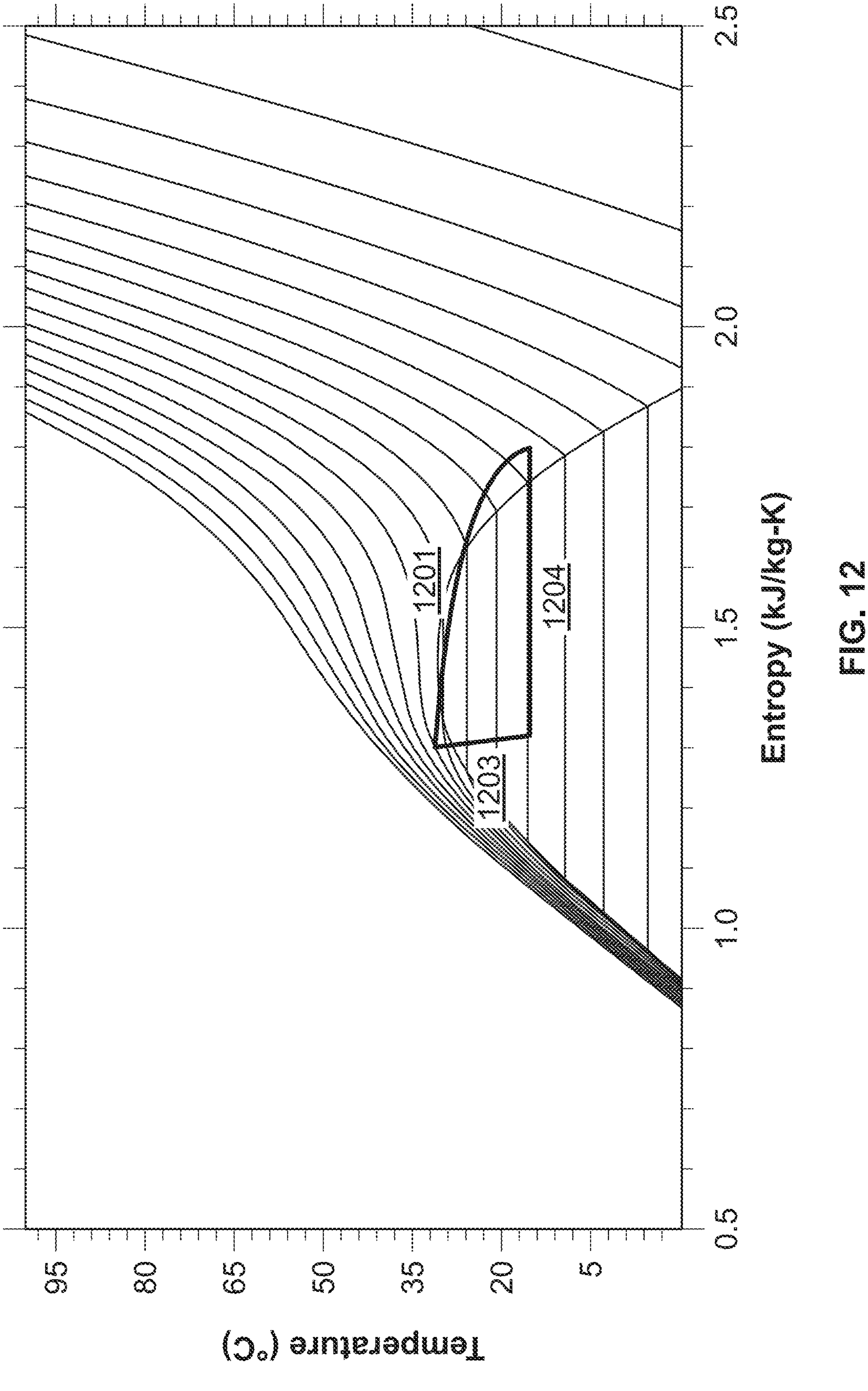
FIG. 12 shows a cooling cycle with combined compression and fluid cooling, without isobaric fluid cooling.

FIG. 12 shows a second example of a $CO_2$ vapor compression cycle provided by the present disclosure. In this cycle, compression and cooling (path 1201) are combined without isobaric fluid cooling. The exact path of 1201 in T-s space depends on the compressor design. This cycle may need a challenging compressor design as the compressor performs all the entropy reduction that occurs between the post-evaporation state and pre-expansion state. This step is followed by near isentropic expansion step 1203 and near isentropic expansion step 1204.

Figure 13:
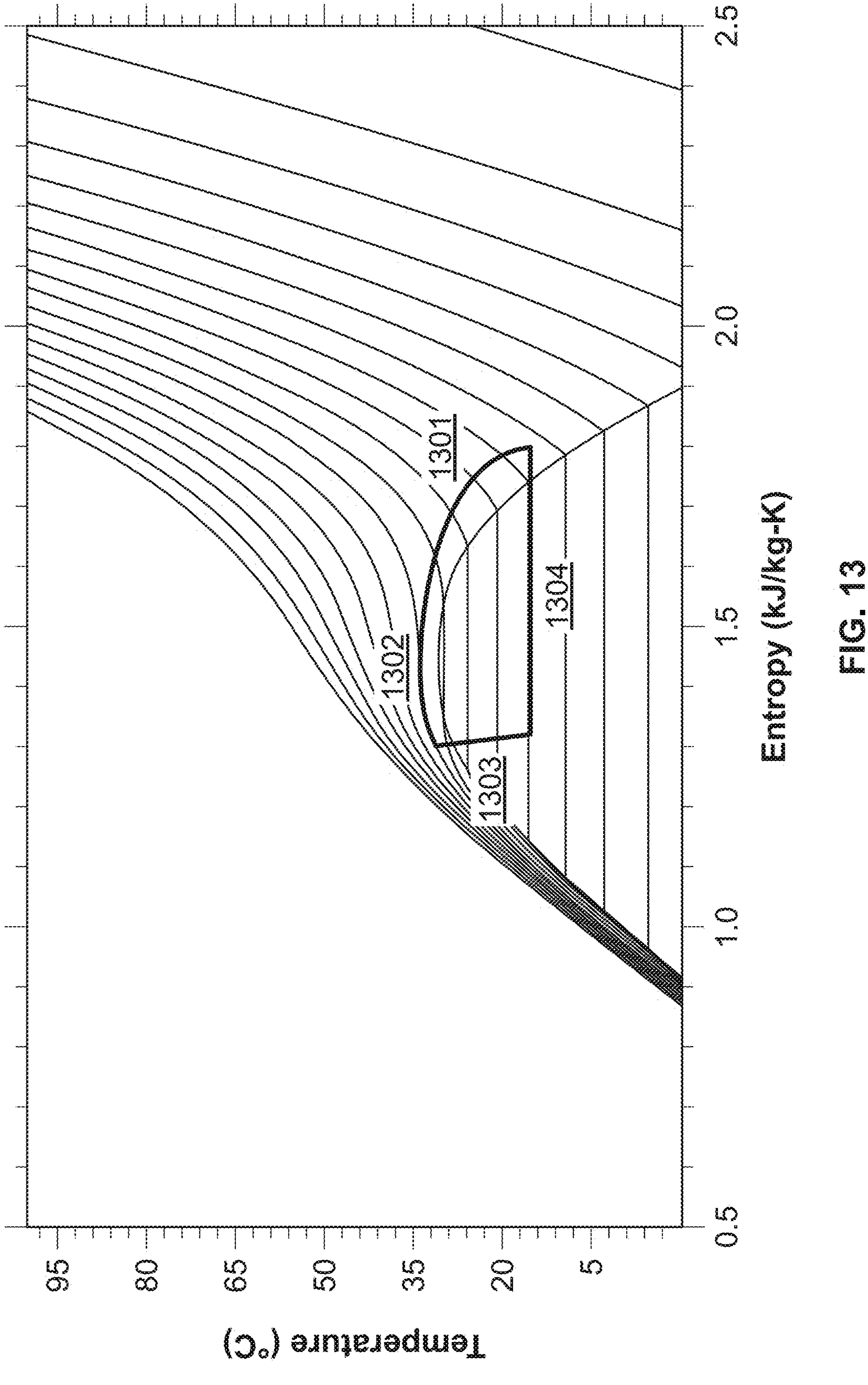
FIG. 13 shows a cooling cycle with combined compression and fluid cooling (1301), followed by isobaric fluid cooling (1302).

FIG. 13 illustrates another example of a $CO_2$ compression cycle provided by the present disclosure. In this cycle some isobaric fluid cooling (path 1302 occurs prior to expansion path 1303). This additional fluid cooling reduces the simultaneous cooling requirements of the compressor. Some isobaric cooling, for example, using a heat exchanger, may be easier to accomplish than having no isobaric cooling. In non-isobaric cooling both the pressure and temperature of the fluid must be controlled. FIG. 13 also shows near-isentropic compression step 1301 and near-isentropic expansion step 1304.

A compressor provided by the present disclosure with integrated cooling can perform the steps of (1) near isentropic compression of a fluid to a lower pressure than that of the pre-expansion state, and (2) isothermal fluid cooling to raise the pressure of the fluid to the pre-expansion state (as shown in FIG. 11) to be combined in a process represented by a smooth curve in T-s space as shown in FIGS. 12 and 13. A method of cooling a fluid provided by the present disclosure uses a transcritical vapor compression cycle comprising: (1) near isentropically compressing and simultaneously cooling a working fluid to provide a compressed working fluid: (2) isobarically cooling the compressed working fluid to provide an isobarically cooled compressed working fluid; (3) near isentropically expanding the isobarically cooled compressed working fluid to provide an expanded working fluid; and (4) isobarically evaporating the expanded working fluid to provide an evaporated working fluid.

Steps (1)-(4) can be repeated.

The step of isentropically comprising and simultaneously cooling the working fluid can be a two-stage process. For example, in a first stage, compression of the working fluid raises the temperature and in a second stage, the compression is isothermal. The second stage compression can be accomplished using a compressor provided by the present disclosure.

The working fluid can be a refrigerant such as $CO_2$.

The method can exhibit a coefficient of performance, for example, from 1 to 10, where the coefficient of performance is defined by the heat removed divided by the energy required to remove the heat.

A method of cooling a refrigerant provided by the present disclosure can comprise: (1) near isentropically compressing and simultaneously isothermally cooling a refrigerant to provide a cooled, compressed refrigerant: (2) isentropically expanding the cooled compressed refrigerant to provide an expanded refrigerant; and (3) isobarically evaporating the expanded refrigerant to provide an evaporated refrigerant.

A method of simultaneously compressing and cooling a working fluid can comprise using a compressor provided by the present disclosure.

A method provided by the present disclosure can comprise: flowing a working fluid into a compression chamber; flowing a first fluid into a first actuation chamber to cause a at least a portion of a first compression chamber wall separating the compression chamber and the first actuation chamber to move toward a center of the compression chamber and thereby decrease a volume of the compression chamber; and simultaneously adding heat to the working fluid in the compression chamber or extracting heat from the working fluid in the compression chamber by flowing a heat exchange fluid through the first actuation chamber or by flowing a heat exchange fluid through a second actuation chamber in thermal contact with the compression chamber.

A method provided by the present disclosure can comprise: flowing a working fluid into a compression chamber; flowing a first fluid into a first actuation chamber, causing a first compression wall separating the compression chamber and the first actuation chamber to compress the working fluid in the compression chamber; and simultaneously adding heat to the working fluid or extracting heat from the working fluid by flowing a second fluid through a second actuation chamber, wherein the compression chamber and the second actuation chamber are separated by a second compression chamber wall, wherein at least a portion of the first compression chamber wall is movable, and at least a portion of the second compression chamber wall is movable or the second compression chamber wall is rigid.

A method of cooling a working fluid provided by the present disclosure can comprise: (1) near isentropically compressing and simultaneously isothermally cooling a working fluid to provide a cooled, compressed working fluid: (2) near isentropically expanding the cooled compressed working fluid to provide an expanded working fluid; and (3) isobarically evaporating the expanded working fluid to provide an evaporated working fluid.

In a method provided by the present disclosure a working fluid can be a refrigerant such as such as $CO_2$.

A method of cooling a refrigerant provided by the present disclosure can comprise simultaneously compressing and cooling a refrigerant to provide a cooled, compressed refrigerant such as cooled compressed $CO_2$.

The method can be accomplished using a compressor provided by the present disclosure.

ASPECTS

The invention can be defined by one or more of the following aspects.

Aspect 1. A compressor comprising: a compression chamber; an actuation chamber; and a compression chamber wall separating the compression chamber and the actuation chamber, wherein at least a portion of the compression chamber wall is movable.

Aspect 2. The compressor of aspect 1, wherein at least a portion of the compression chamber wall is movable in response to a pressure differential between a working fluid in the compression chamber and an actuation fluid in the actuation chamber.

Aspect 3. The compressor of any one of aspects 1 to 2, wherein, the compression chamber wall comprises a perimeter; and the perimeter is not movable.

Aspect 4. The compressor of any one of aspects 1 to 3, wherein the compressor comprises an enclosure, wherein, the enclosure surrounds the compression chamber and the actuation chamber; and a perimeter of the compression chamber wall is physically attached to the enclosure.

Aspect 5. The compressor of aspect 4, wherein, the enclosure comprises rigid enclosure walls; and the perimeter of the compression chamber wall is physically attached to the rigid enclosure walls.

Aspect 6. The compressor of any one of aspects 1 to 2, wherein the actuation chamber surrounds the compression chamber.

Aspect 7. The compressor of aspect 6, comprising: one or more compression chambers, wherein a movable wall independently surrounds each of the one or more compression chambers; the actuation chamber surrounds each of the one or more compression chambers; and rigid enclosure wall surrounds the actuation chamber.

Aspect 8. The compressor of any one of aspects 1 to 2, wherein the compressor comprises two or more compression chambers and three or more actuation chambers and a compression chamber wall independently separating each compression chamber from an adjacent actuation chamber.

Aspect 9. The compressor of aspect 8, wherein each compression chamber is adjacent a first actuation chamber and a second actuation chamber.

Aspect 10. The compressor of any one of aspects 8 to 9, wherein each compression chamber comprises a first compression chamber wall and a second compression chamber wall.

Aspect 11. The compressor of aspect 10, wherein the compression chamber wall separates a compression chamber from a first actuation chamber, and the second compression chamber wall separates the compression chamber from a second actuation chamber.

Aspect 12. The compressor of aspect 11, wherein at least a portion of the second compression chamber wall is movable.

Aspect 13. The compressor of aspect 11, wherein the second compression chamber wall is rigid.

Aspect 14. The compressor of any one of aspects 11 to 13, wherein, the actuation chamber comprises a first actuation fluid; and the second actuation chamber comprises a second activation fluid, wherein the first activation fluid and the second activation fluid are the same.

Aspect 15. The compressor of any one of aspects 11 to 13, wherein, the actuation chamber comprises an actuation fluid; and the second actuation chamber comprises a second actuation fluid, wherein the first activation fluid and the second activation fluid are different.

Aspect 16. The compressor of any one of aspects 1 to 15, wherein each compression chamber comprises a working fluid.

Aspect 17. The compressor of any one of aspects 1 to 16, wherein each actuation chamber independently comprises fluid.

Aspect 18. The compressor of aspect 17, wherein the fluid is selected from a heat exchange fluid and an actuation fluid.

Aspect 19. The compressor of any one of aspects 1 to 18, wherein at least a portion of the compression chamber wall is reversibly movable.

Aspect 20. The compressor of aspect 19, wherein at least a portion of the first compression chamber wall is reversibly movable in response to a pressure differential across the compression chamber wall.

Aspect 21. The compressor of any one of aspects 19 to 20, wherein at least a portion of the compression chamber wall is reversibly movable within a pressure range from 2 MPa to 18 MPa.

Aspect 22. The compressor of any one of aspects 19 to 21, wherein a perimeter of the compression chamber wall is fixed during movement of the compression chamber wall.

Aspect 23. The compressor of any one of aspects 19 to 21, wherein at least a portion of the compression chamber wall is configured to reversibly move toward a center of the compression chamber in response to a pressure exerted by a fluid in the actuation chamber.

Aspect 24. The compressor of any one of aspects 19 to 23, wherein the entire compression chamber wall is reversibly movable.

Aspect 25. The compressor of any one of aspects 1 to 23, wherein the center of the compression chamber wall is reversibly movable.

Aspect 26. The compressor of any one of aspects 1 to 25, wherein the compression chamber wall is in the form of a plate.

Aspect 27. The compressor of any one of aspects 1 to 25, wherein the compression chamber wall is in the form of a tube.

Aspect 28. The compressor of any one of aspects 1 to 25, wherein the compression chamber wall is corrugated.

Aspect 29. The compressor of any one of aspects 1 to 23, wherein the compression chamber wall has a variable thickness.

Aspect 30. The compressor of any one of aspects 1 to 29, wherein the compression chamber wall comprises one or more flexible sections and one or more rigid sections.

Aspect 31. The compressor of aspect 30, wherein the one or more flexible sections are disposed toward a perimeter of the compression chamber wall and a rigid section is disposed in the center of compression chamber movable wall.

Aspect 32. The compressor of any one of aspects 30 to 31, wherein each of the one or more flexible sections comprises a spring, a bellows, or an elastomer.

Aspect 33. The compressor of any one of aspects 1 to 32, wherein the compression chamber wall is characterized by a thermal conductivity from 15 W/mK to 1,000 W/mK.

Aspect 34. The compressor of any one of aspects 1 to 33, wherein the compression chamber wall is characterized by a thermal transfer coefficient from 50 $W/m^2K$ to 2,000 $W/m^2K$.

Aspect 35. The compressor of any one of aspects 1 to 34, wherein the compression chamber wall is characterized by a thickness from 0.5 mm to 2 mm.

Aspect 36. The compressor of any one of aspects 1 to 35, wherein the compression chamber wall is characterized by a deflection coefficient from 1000 to 10,000 at a pressure from 2 MPa to 18 MPa.

Aspect 37. The compressor of any one of aspects 1 to 36, wherein the compression chamber wall comprises a shape memory alloy.

Aspect 38. The compressor of any one of aspects 1 to 37, wherein, the compressor comprises a mechanical actuator physically coupled to the compression chamber wall; and the mechanical actuator is configured to move at least a portion of the compression chamber wall.

Aspect 39. The compressor of any one of aspects 1 to 37, wherein, the compressor comprises a mechanical actuator configured to be physically coupled to the compression chamber wall; and the mechanical actuator is configured to move at least a portion of the compression chamber wall.

Aspect 40. The compressor of any one of aspects 1 to 39, wherein the compression chamber is characterized by a surface-area-to volume ratio from 1 $mm^{-1}$ to 1,000 $mm^{-1}$.

Aspect 41. The compressor of any one of aspects 1 to 40, wherein the compression chamber is characterized by a length from 5 cm to 30 cm and a width from 5 cm to 30 cm, wherein length refers to the direction of fluid flow, and width refers to the direction orthogonal to the direction of fluid flow.

Aspect 42. The compressor of any one of aspects 1 to 41, wherein the compression chamber is characterized by a volume from 5 $cm^3$ to 180 $cm^3$.

Aspect 43. The compressor of any one of aspects 1 to 42, wherein the actuation chamber is characterized by a volume from 50 $cm^3$ to 1,000 $cm^3$ Aspect 44. The compressor of any one of aspects 1 to 43, wherein the actuation chamber is characterized by a surface-area-to volume ratio from 0.1 $mm^{-1}$ to 1,000 $mm^{-1}$.

Aspect 45. The compressor of any one of aspects 1 to 44, wherein the compressor comprises: a second actuation chamber; and a second compression chamber wall separating the compression chamber from the second actuation chamber.

Aspect 46. The compressor of aspect 45, wherein the second compression chamber wall is rigid.

Aspect 47. The compressor of any one of aspects 45 to 46, wherein at least a portion of the second compression chamber wall is flexible.

Aspect 48. The compressor of any one of aspects 45 to 47, wherein at least a portion of the second compression chamber wall is movable.

Aspect 49. The compressor of any one of aspects 45 to 48, wherein at least a portion of the second compression chamber wall is reversibly movable.

Aspect 50. The compressor of any one of aspects 45 to 49, wherein the second compression chamber wall is movable within a pressure range from 2 MPa to 18 MPa.

Aspect 51. The compressor of any one of aspects 45 to 50, wherein at least a portion of the second compression chamber wall is configured to move toward a center of the compression chamber in response to pressure exerted by a fluid in the second actuation chamber.

Aspect 52. The compressor of any one of aspects 45 to 51, wherein the second compression chamber wall is configured to transfer heat from a working fluid in the compression chamber to a fluid in the second actuation chamber.

Aspect 53. The compressor of any one of aspects 45 to 52, wherein the second compression chamber wall is characterized by a thermal conductivity from 15 W/mK to 1,000 W/mK.

Aspect 54. The compressor of any one of aspects 45 to 53, wherein the second compression chamber wall is characterized by a thermal transfer coefficient from 50 $W/m^2K$ to 2,000 $W/m^2K$ Aspect 55. The compressor of any one of aspects 45 to 54, wherein the second compression chamber wall is characterized by a thickness from 0.5 mm to 2 mm.

Aspect 56. The compressor of any one of aspects 45 to 55, wherein the second compression chamber wall is characterized by a deflection coefficient (plate width to maximum plate movement) from 1,000 to 10,000 at a pressure from 2 MPa to 18 MPa.

Aspect 57. The compressor of any one of aspects 45 to 56, wherein the second actuation chamber is characterized by a volume from 50 $cm^3$ to 10,000 $cm^3$ Aspect 58. The compressor of any one of aspects 1 to 57, wherein the compressor comprises: a compression chamber inlet fluidly coupled to the compression chamber; a compression chamber outlet fluidly coupled to the compression chamber; an actuation chamber inlet fluidly coupled to the actuation chamber; and an actuation chamber outlet fluidly coupled to the actuation chamber.

Aspect 59. The compressor of any one of aspects 1 to 58, wherein the compression chamber comprises a working fluid.

Aspect 60. The compressor of aspect 59, wherein the working fluid is a refrigerant.

Aspect 61. The compressor of any one of aspects 59 to 60, wherein the working fluid is a liquid.

Aspect 62. The compressor of any one of aspects 59 to 60, wherein the working fluid is a gas.

Aspect 63. The compressor of aspect 59, wherein the working fluid is $CO_2$.

Aspect 64. The compressor of any one of aspects 1 to 63, wherein the actuation chamber comprises a fluid.

Aspect 65. The compressor of aspect 64, wherein the fluid has a high thermal conductivity and a low viscosity.

Aspect 66. The compressor of aspect 65, wherein the fluid is a liquid.

Aspect 67. The compressor of aspect 65, wherein the fluid is a gas.

Aspect 68. A cooling system comprising the compressor of any one of aspects 1 to 67.

Aspect 69. The cooling system of aspect 68, wherein the cooling system comprises a heat exchanger, a cooler, an expander, a condenser, an evaporator, or a combination of any of the foregoing Aspect 70. The cooling system of any one of aspects 68 to 69, wherein the cooling system comprises a working fluid distribution unit.

Aspect 71. The cooling system of aspect 70, wherein the working fluid distribution unit is configured to receive compressed working fluid from the compressor.

Aspect 72. The cooling system of any one of aspects 68 to 71, wherein the cooling system comprises a fluid delivery unit.

Aspect 73. The cooling system of aspect 72, wherein the delivery unit is configured to deliver saturated working fluid to a target apparatus.

Aspect 74. A method of simultaneously compressing and cooling a working fluid using the compressor of any one of aspects 1 to 67.

Aspect 75. A method comprising: flowing a working fluid into a compression chamber; flowing a first fluid into a first actuation chamber to cause at least a portion of a compression chamber wall separating the compression chamber and the first actuation chamber to move toward a center of the compression chamber and thereby decrease a volume of the compression chamber; and simultaneously adding heat to the working fluid in the compression chamber or extracting heat from the working fluid in the compression chamber by flowing a heat exchange fluid through the first actuation chamber or by flowing a heat exchange fluid through a second actuation chamber in thermal contact with the compression chamber.

Aspect 76. A method comprising: flowing a working fluid into a compression chamber; flowing a first fluid into a first actuation chamber, causing a first compression wall separating the compression chamber and the first actuation chamber to compress the working fluid in the compression chamber; and simultaneously adding heat to the working fluid or extracting heat from the working fluid by flowing a second fluid through a second actuation chamber, wherein the compression chamber and the second actuation chamber are separated by a second compression chamber wall, wherein at least a portion of the first compression chamber wall is movable, and at least a portion of the second compression chamber wall is movable or the second compression chamber wall is rigid.

Aspect 77. A method of transferring heat using a transcritical vapor compression cycle comprising: (1) near isentropically compressing and simultaneously cooling a working fluid to provide a compressed working fluid: (2) isobarically cooling the compressed working fluid to provide an isobarically cooled compressed working fluid; (3) near isentropically expanding the isobarically cooled compressed working fluid to provide an expanded working fluid; and (4) isobarically evaporating the expanded working fluid to provide an evaporated working fluid.

Aspect 78. A method of cooling a working fluid comprising: (1) near isentropically compressing and simultaneously isothermally cooling a working fluid to provide a cooled, compressed working fluid: (2) near isentropically expanding the cooled compressed working fluid to provide an expanded working fluid; and (3) isobarically evaporating the expanded working fluid to provide an evaporated working fluid.

EXAMPLES

It should be noted that there are alternative ways of implementing the embodiments disclosed herein. Accordingly, the present embodiments are to be considered as illustrative and not restrictive. Furthermore, the claims are not to be limited to the details given herein and are entitled their full scope and equivalents thereof.

Example 1

$CO_2$ Parallel Plate Compressor

Figure 14:
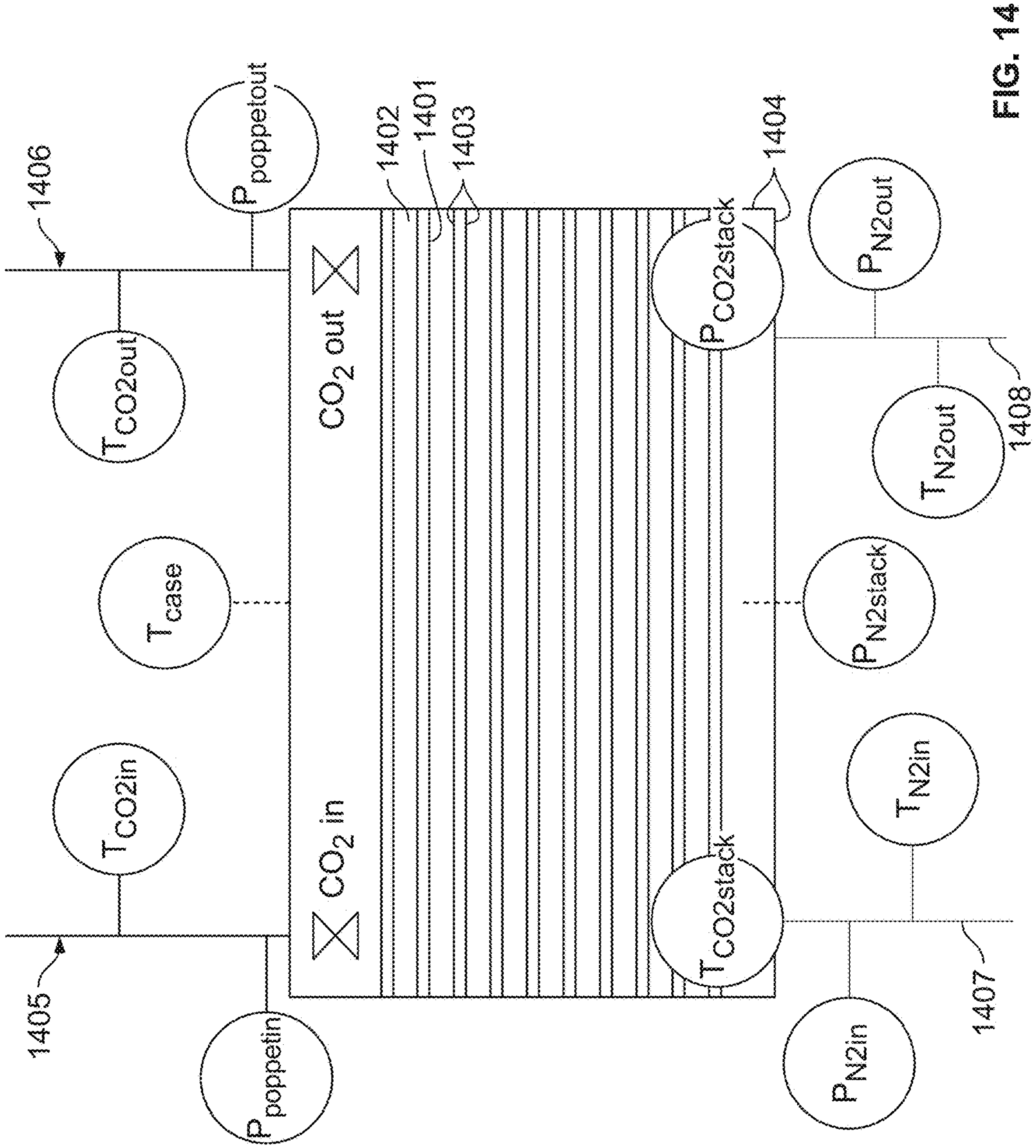
FIG. 14 shows details of an example of a stacked plate compressor provided by the present disclosure.
Figure 15:
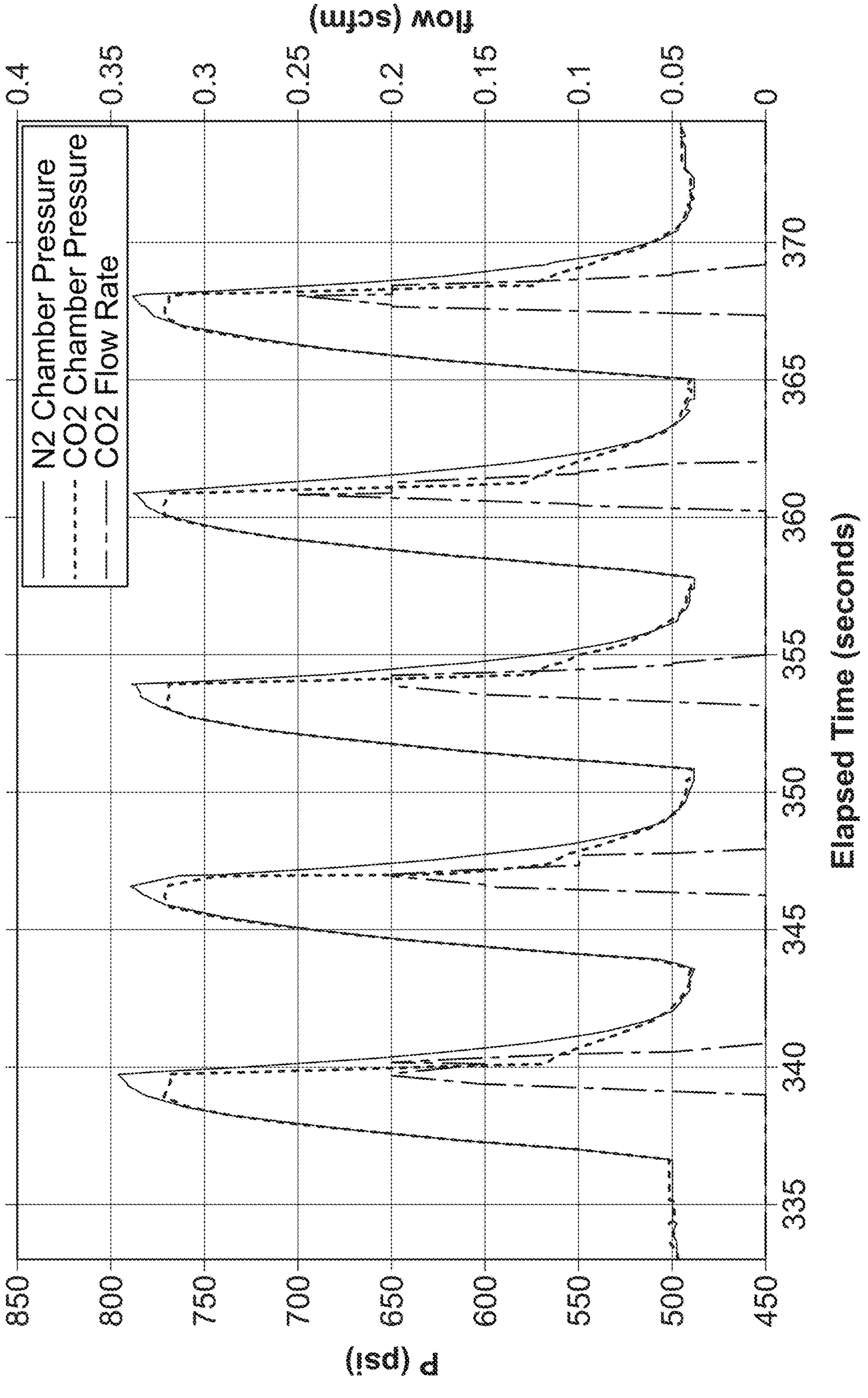
FIG. 15 shows fluid pressures and flow rates during operation of an example of a stacked plate compressor provided by the present disclosure.

FIG. 14 is a detailed view of a compressor used to obtain the experimental results presented in FIG. 15. FIG. 14 shows a compressor including rigid compressor wall 1404, compression chambers 1401 with movable compression chamber walls, actuation chambers 1402, $CO_2$ inlet 1405 and $CO_2$ outlet 1406, $N_2$ inlet 1407 and $N_2$ outlet 1408. FIG. 14 also shows various temperature sensors "T" and pressure sensors "P". The compressor shown in FIG. 14 has 10 stacks of compression and actuation chamber pairs. The compressor used $N_2$ as the actuation fluid and $CO_2$ and the working fluid.

The surface area of each movable wall was 100 cm$^2$ and was made of stainless steel, $CO_2$ compression was observed from 3.5 MPa/500 psi to 5.2 MPa/750 psi. All measurements were made at room temperature.

FIG. 15 shows the $N_2$ actuation chamber pressure, the $CO_2$ compression chamber pressure, and the $CO_2$ flow rate in the compressor during operation through five compression cycles. The results are provided for a ten-stack compressor provided by the present disclosure.

As shown in FIG. 15, increasing the $N_2$ pressure results in an increase in the $CO_2$ pressure. After compression, the higher pressure $CO_2$ is ejected from the compressor and the $N_2$ pressure decreases. The $N_2$ pressure cycles between 500 psi and 800 psi. The $CO_2$ pressure cycles between 500 psi and 750 psi. The setpoints of the $N_2$ pressure and the $CO_2$ pressure can be changed.

Table 1 shows an example of design parameters of an industrial compressor using $CO_2$ as the working fluid.

TABLE 1

Industrial design parameters for a $CO_2$ compressor.

| Parameter | Typical | Min | Max |
|---|---|---|---|
| Cooling Load | 1 MW | 0.25 MW | 10 MW |
| Mass flow | 7.5 kg/s | 1.5 kg/s | 80 kg/s |
| Min/Max Pressure | 5.4 MPa/9 MPa<br>780 psi/1,300 psi | 2 MPa/7 MPa<br>290 psi/1,000 psi | 7 MPa/18 MPa<br>1,000 psi/2,600 psi |
| Min/Max Temperature | 15° C./40° C. | −10° C./35° C. | 30° C./60° C. |
| Surface Area/ Volume | 9.4 mm$^{-1}$ | 1 mm$^{-1}$ | 100 mm$^{-1}$ |
| Plate Length/ Plate Movement | 3,000 | 1,000 | 10,000 |
| Wall Thermal Conductivity | 50 W/mK | 15 W/mK | 1,000 W/mK |
| Wall Thickness | 1 mm | 0.5 mm | 2 mm |

It should be noted that there are alternative ways of implementing the embodiments disclosed herein. Accordingly, the present embodiments are to be considered as illustrative and not restrictive. Furthermore, the claims are not to be limited to the details given herein and are entitled their full scope and equivalents thereof.

What is claimed is:

1. A compressor comprising:

two or more compression chambers;

three or more actuation chambers; and a compression chamber wall separating each compression chamber from an adjacent actuation chamber, wherein each compression chamber is adjacent a first actuation chamber and a second actuation chamber;

wherein a first compression chamber wall separates each compression chamber from the first actuation chamber, and a second compression chamber wall separates each compression chamber from a second actuation chamber; and wherein at least a portion of the first compression chamber wall is movable.

2. The compressor of claim 1, wherein at least a portion of each compression chamber wall is movable in response to a pressure differential between a working fluid in each compression chamber and an actuation fluid in the first actuation chamber or the second actuation chamber.

3. The compressor of claim 1, wherein the first compression chamber wall comprises a perimeter; and the perimeter is not movable.

4. The compressor of claim 1, wherein at least a portion of the second compression chamber wall is movable.

5. The compressor of claim 1, wherein the second compression chamber wall is rigid.

6. The compressor of claim 1, wherein, each compression chamber comprises a working fluid; and each actuation chamber independently comprises a fluid.

7. The compressor of claim 1, wherein each of the first compression chamber wall and the second compression chamber wall is characterized by a thermal conductivity from 15 W/mK to 1,000 W/mK.

8. The compressor of claim 1, wherein each of the first compression chamber wall and the second compression chamber wall is characterized by a thermal transfer coefficient from 50 W/m$^2$K to 2,000 W/m$^2$K.

9. The compressor of claim 1, wherein each of the first compression chamber wall and the second compression chamber wall is characterized by a thickness from 0.5 mm to 2 mm.

10. The compressor of claim 1, wherein each of the first compression chamber wall and the second compression chamber wall is characterized by a deflection coefficient from 1,000 to 10,000 at a pressure from 2 MPa to 18 MPa.

11. The compressor of claim 1, wherein each of the first compression chamber wall and the second compression chamber wall is characterized by a surface-area-to volume ratio from 1 $mm^{-1}$ to 1,000 $mm^{-1}$.

12. The compressor of claim 1, wherein each of the first compression chamber wall and the second compression chamber wall is characterized by a volume from 5 $cm^3$ to 180 $cm^3$.

13. The compressor of claim 1, wherein each of the first compression chamber wall and the second compression chamber wall is characterized by a volume from 50 $cm^3$ to 1,000 $cm^3$.

14. The compressor of claim 1, wherein each actuation chamber is characterized by a surface-area-to volume ratio from 0.1 $mm^{-1}$ to 1,000 $mm^{-1}$.

15. The compressor of claim 1, wherein at least a portion of the second compression chamber wall is flexible.

16. The compressor of claim 1, wherein each compression chamber comprises a working fluid.

17. The compressor of claim 16, wherein the working fluid is $CO_2$.

18. The compressor of claim 1, wherein each actuation chamber comprises a fluid.

19. A cooling system comprising the compressor of claim 1.

20. A compressor comprising:

a compression chamber;

an actuation chamber; and a compression chamber wall separating the compression chamber and the actuation chamber;

wherein at least a portion of the compression chamber wall is movable;

wherein the compression chamber wall comprises one or more flexible sections and one or more rigid sections; and wherein the one or more flexible sections are disposed toward a perimeter of the compression chamber wall and a rigid section is disposed in a center of compression chamber wall.

21. The compressor of claim 20, wherein the compression chamber wall is movable in response to a pressure differential between a working fluid in the compression chamber and an actuation fluid in the actuation chamber.

22. The compressor of claim 20, wherein the compression chamber wall is characterized by a thermal transfer coefficient from 50 $W/m^2K$ to 2,000 $W/m^2K$.

23. The compressor of claim 20, wherein the compression chamber wall is characterized by a thickness from 0.5 mm to 2 mm.

24. The compressor of claim 20, wherein the compression chamber is characterized by a volume from 5 $cm^3$ to 180 $cm^3$.

25. The compressor of claim 20, wherein the compression chamber is characterized by a surface-area-to volume ratio from 1 $mm^{-1}$ to 1,000 $mm^{-1}$.

26. The compressor of claim 20, wherein the actuation chamber is characterized by a volume from 50 $cm^3$ to 1,000 $cm^3$.

27. The compressor of claim 20, wherein the actuation chamber is characterized by a surface-area-to volume ratio from 0.1 $mm^{-1}$ to 1,000 $mm^{-1}$.

28. The compressor of claim 20, wherein the compression chamber comprises a working fluid; and the actuation chamber comprises a fluid.

29. The compressor of claim 28, wherein the working fluid is $CO_2$.

30. A cooling system comprising the compressor of claim 20.

* * * * *